United States Patent [19]
Abe et al.

[11] Patent Number: 5,723,875
[45] Date of Patent: Mar. 3, 1998

[54] CHIP DAMAGE DETECTING CIRCUIT FOR SEMICONDUCTOR IC

[75] Inventors: Noriyuki Abe, Yokohama; Toshimi Abo, Chigasaki; Toshirou Shinohara, Yokosuka, all of Japan

[73] Assignee: Nissan Motor Co., Ltd., Yokohama, Japan

[21] Appl. No.: 736,567

[22] Filed: Oct. 23, 1996

[30] Foreign Application Priority Data

Oct. 24, 1995 [JP] Japan ................................. 7-275485

[51] Int. Cl.$^6$ ........................... H01L 23/58; H01L 27/10
[52] U.S. Cl. ........................ 257/48; 257/203; 257/204; 257/206; 257/208; 257/210; 257/369; 257/577
[58] Field of Search ........................... 257/48, 203, 204, 257/206, 208, 210, 369, 577

[56] References Cited

U.S. PATENT DOCUMENTS

| | | | |
|---|---|---|---|
| 5,051,690 | 9/1991 | Maly et al. | 324/158 R |
| 5,619,462 | 4/1997 | McClure | 365/201 |
| 5,654,582 | 8/1997 | Kijima et al. | 257/620 |
| 5,654,588 | 8/1997 | Dasse et al. | 257/754 |

FOREIGN PATENT DOCUMENTS 6-77300  3/1994  Japan.

*Primary Examiner*—Ngân V. Ngô
*Attorney, Agent, or Firm*—Foley & Lardner

[57] ABSTRACT

A semiconductor integrated circuit has a chip check circuit for detecting cracks and other defects in the chip during operation. The chip check circuit extends in the chip from an input terminal to an output terminal so as to scan a predetermined wide area. The chip check circuit has at least one signal line extending near or within a circuit block in the chip so that the signal line can be broken together with the circuit block. The chip check circuit may further comprise one or more inverters, and/or one or more two-wire logic circuits.

28 Claims, 18 Drawing Sheets

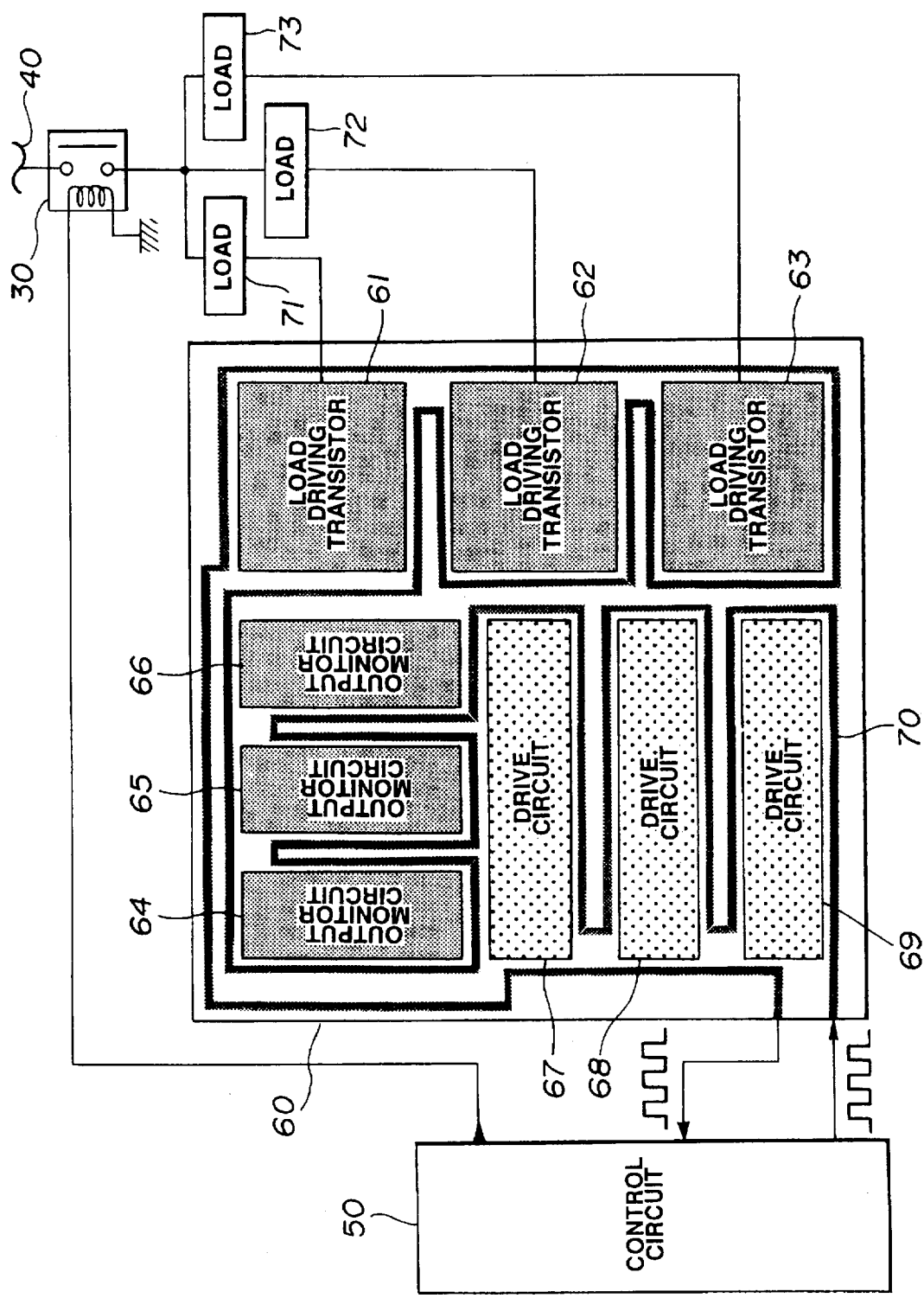

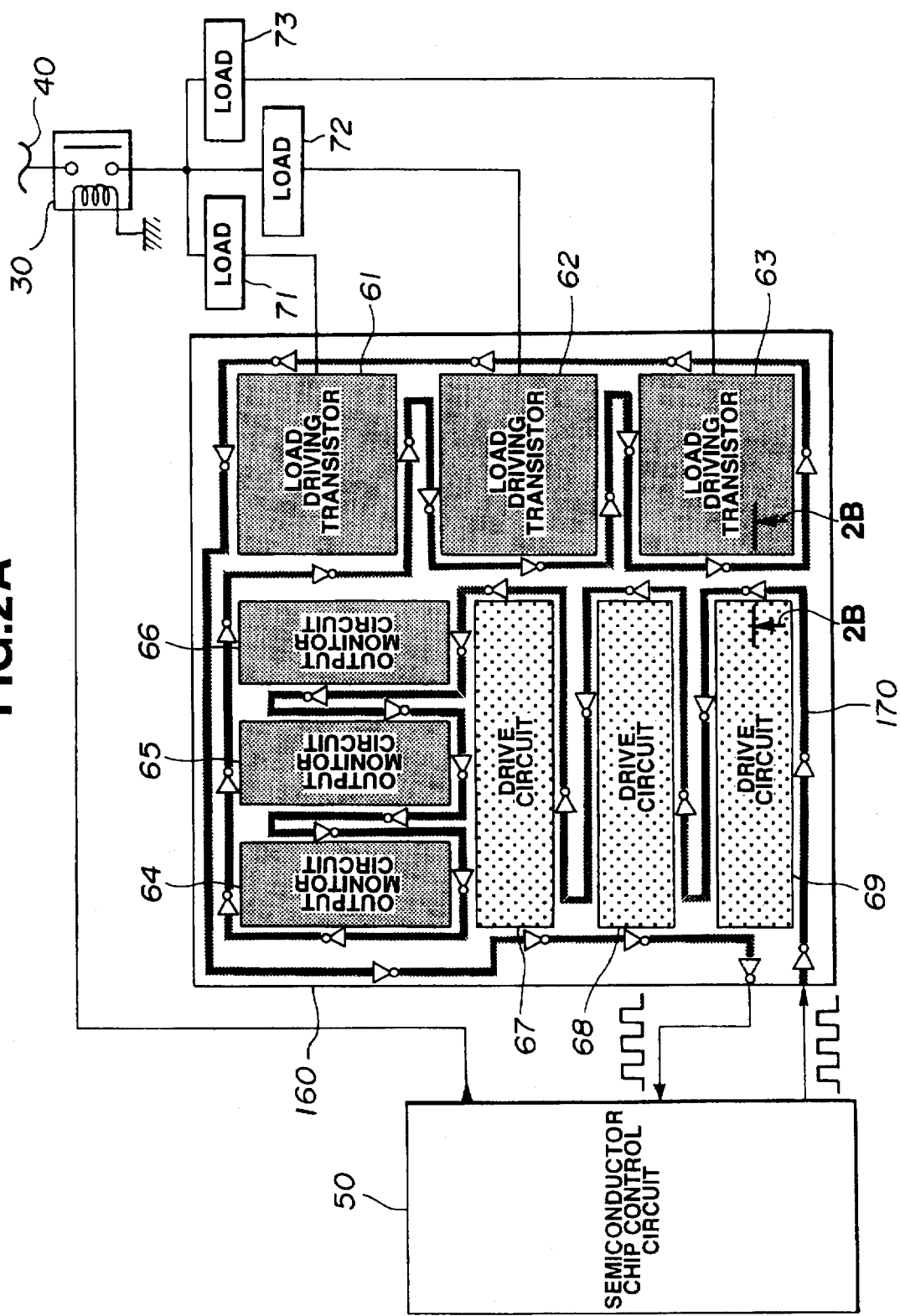

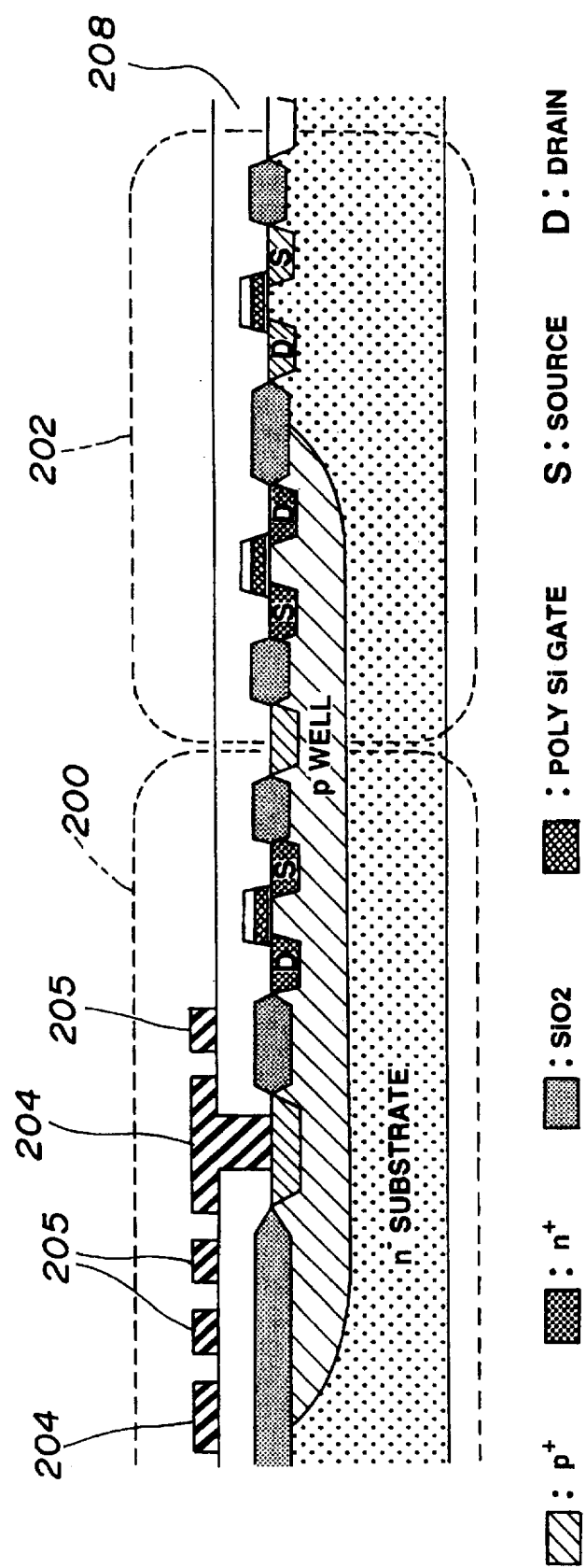

| | INPUT | | OUTPUT |
|---|---|---|---|
| | I1 | I0 | Y |
| LOGIC 1 | 1 | 0 | 1 |
| LOGIC 0 | 0 | 1 | 0 |
| NON-CODE (FAULT) | 0 | 0 | Z |
| NON-CODE (FAULT) | 1 | 1 | Z |

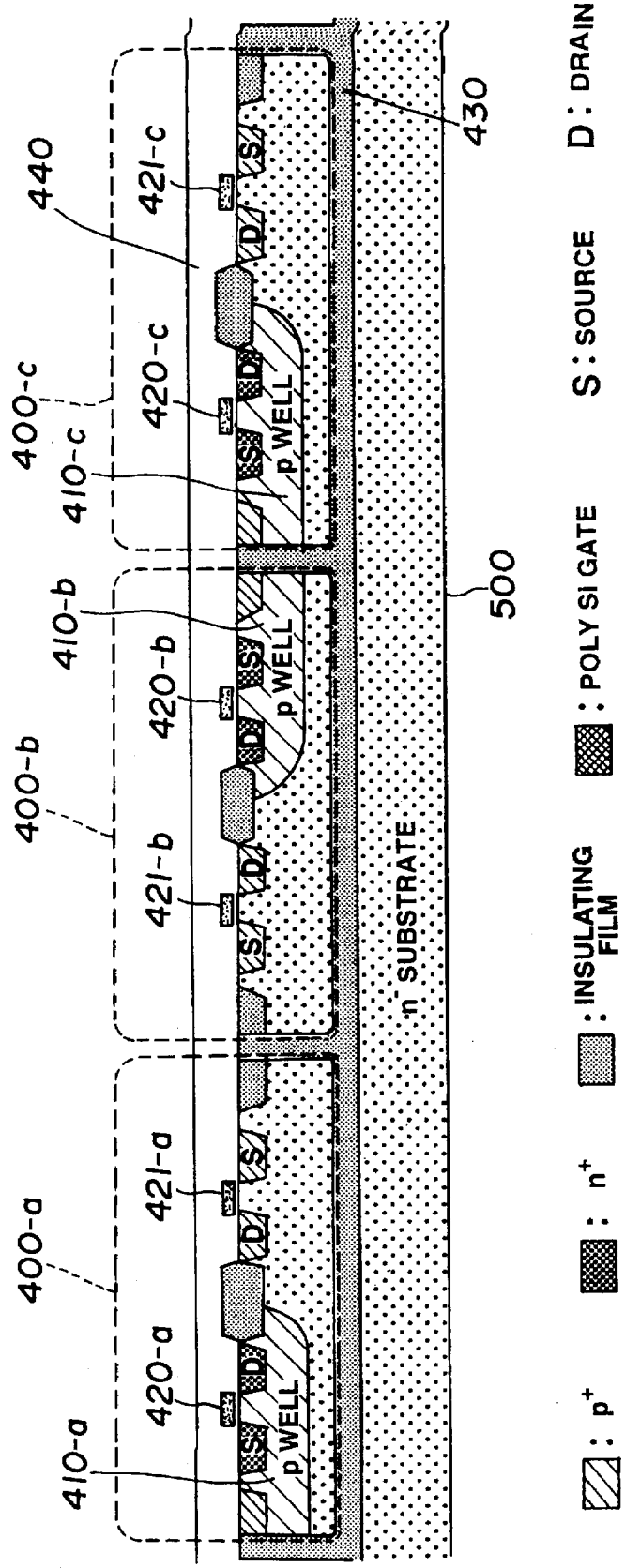

|  | INPUT | | OUTPUT |
|---|---|---|---|
|  | (A1, A0) (B1, B0) | (B1, B0) (A1, A0) | (Y1, Y0) |
| NORMAL OUTPUTS | (1, 0) * | (1, 0) (0, 1) | (1, 0) (0, 1) |
| ABNORMAL OUTPUTS | (1, 1) (0, 0) | (1, 0) (1, 0) | (0, 0) (1, 1) |

∗ : ANY VALUE

CHIP DAMAGE DETECTING CIRCUIT FOR SEMICONDUCTOR IC

BACKGROUND OF THE INVENTION

The present invention relates to a semiconductor integrated circuit and a chip damage detecting circuit, structure or method for a semiconductor integrated circuit. In particular, the present invention relates to a semiconductor integrated circuit adapted to automatically place an electronic system in a safe state by facilitating accurate detection of faults in the semiconductor chip even when the chip suffers simultaneous chip defects such as crack, burning or rupture in oxide film or interconnection structure.

FIG. 11 shows, as an example, a conventional electronic system employing a semiconductor integrated circuit. The system of this example is used as one of various control systems in an automobile. A controller 10 shown in FIG. 11 is arranged to control a load 20 in accordance with various input data. The controller 10 has a control circuit 1, a load driving transistor 2, a drive circuit 3 and an output monitor circuit 4.

The control circuit 1 turns on and off the load driving transistor 2 through the drive circuit 3. The drive circuit 3 performs a level shift function for applying a voltage of a proper level to the gate of the load driving transistor 2. The control circuit 1 monitors the output terminal voltage of the load driving transistor 2 through the output monitor circuit 4, and stops driving the load by switching a fail-safe relay 30 connected between the load 20 and a power supply line 40, to an open state to secure the safety of the system.

When the control circuit 1 is generating the signal to turn on the load driving transistor 2, the voltage of the output terminal of the transistor 2 is at a level close to the ground level as long as the load 20 and the load driving transistor 2 are normal. When the potential of this output terminal is higher than a predetermined value, possible causes are short-circuit of the load 20, and open circuit failure of the load driving transistor 2. When, on the other hand, the control circuit 2 is generating the signal to turn off the load driving transistor 2, the output terminal voltage is approximately at the power supply level as long as the system is normal. If the output terminal voltage is lower than a predetermined value, a possible cause is a short circuit failure in the load driving transistor 2.

In general, the control circuit 1 employs a microcomputer to perform sophisticated judgment and computation. When relatively simple operations suffice, ASIC can be employed. In many cases, the load driving transistor 2, the drive circuit 3 and the output monitor circuit 3 are integrated in a semiconductor chip to reduce the size and cost of the system.

In the conventional system, the integration of electronic components causes the following problems.

The semiconductor chip in which the load driving transistor 2, the drive circuit 3 and the monitor circuit 4 are integrated may be broken simultaneously at two or more different positions by external or internal stress to an abnormal extent. If, in this case, the load driving transistors 2 is short-circuited and at the same time the monitor circuit 4 is fixed at the state generating the monitor output signal indicating the off state of the load driving transistor 2 (the output terminal potential at the supply potential level in the afore-mentioned example), then the control circuit 1 is unable to detect the abnormality and hence unable to open the fail-safe relay 30. In this case, the load driving transistor 2 continues to be on, and the load 20 remains driven in spite of the off command signal of the control circuit 1 to stop the driving of the load 20.

A means for detecting such an abnormal condition may be provided, aside from the semiconductor chip. However, this increases the size and cost of the system.

Japanese Patent Provisional Publication No. 6-77300 shows a conventional configuration for detecting minute cracks formed in a chip during a semiconductor fabricating process. FIG. 12A shows a semiconductor chip 11 according to this conventional example, and FIG. 12B shows the section. The semiconductor chip 11 shown in FIGS. 12A and 12B has a central circuit section 12 in which various devices are formed, input and output aluminum pads 13, an inspection pad 13a, a pad 13b connected to the substrate, an n-type diffusion regions 15a, a p-type Si substrate 17, a field oxide film 18, and a protective PSG film 19. A loop-shaped aluminum ring 14 is formed on, and connected with, an n-type diffusion region 15 which is formed in the form of a loop in the marginal area of the chip. The aluminum ring 14 is connected by a polysilicon connector 16 to the inspection pad 13a. Furthermore, the inspection pad 13a is connected with the circuit section 12 by a polysilicon connector 16a.

The semiconductor chip 11 is liable to crack due to stress during fabricating operations such as die bonding, wire bonding and resin molding. If a crack is formed somewhere in the pn junction between the n-type diffusion 15 and the p-type substrate 17, voltage application to the inspection pad 13a and the pad 13b connected to the substrate 17, reverse-biasing the n diffusion region 15 and the p substrate 17 causes leak current. Therefore, the crack can be detected by checking the existence or nonexistence of the leak current.

Another example shown in the above-mentioned Japanese Patent Provisional Publication No. 6-77300 utilizes an impurity diffusion layer which has a conductivity type opposite to that of the substrate and which is formed at a position where a crack is likely to occur by stress from the backside by a push-up pin during the fabrication process. The chip further has a first pad connected to the impurity diffusion layer and a second pad connected to the substrate. This example is arranged to detect a minute crack in the chip surface by detaching a leak current in the state in which the substrate and the impurity diffusion layer are reverse biased.

This chip damage detecting technique which is aimed at detecting cracks during the IC fabrication process is not so effective in detecting faults during the actual operation of the electronic device.

First, the accurate and speedy detection of the leak current is difficult specifically while the semiconductor chip is working. During the fabrication process, inspection can be done while the semiconductor integrated circuit is put out of operation and held in a static state. When, on the other hand, the semiconductor integrated circuit is operated, for example as a component of an electronic system on a motor vehicle, variation of current caused by parasitic capacitance formed at or around the pn junction and on-off operations of nearby transistors make it very difficult to discriminate a leak current indicative of abnormality in the pn junction from a transient current variation due to normal circuit operations.

Furthermore, the quick detection of an abnormal pn junction requires a high precision leak current measurement of an order from nanoampere to milliampere, for example. Such an accurate current measuring system increases the cost significantly.

In the inspection of the fabrication process, one inspection system can inspect a great number of chips, so that the cost of the inspection equipment is not so critical. In the application to automobiles, by contrast, an inspection system must be installed in each unit, so that the cost of inspection is crucial.

Second, the chip damage detecting technique of the aforementioned Japanese document is unable to detect various other failures such as corrosion or electromigration in metallization and breakage in a gate oxide film of a MOS transistor. The conventional system cannot initiate the fail-safe action in the event of such a failure.

Third, the chip damage detecting technique of the aforementioned Japanese document is unable to detect failures in various functional circuits in the chip. The detection of the conventional system is limited to damage in the marginal area of the chip. During device operations, cracks or other defects can occur anywhere in the chip, and it is not possible to predict the position of a defect Fourth, the chip damage detecting technique of the aforementioned Japanese document tends to increase the required chip size by requiring one or more impurity diffusion regions for damage detection. The use of a trench may restrain the increase of the chip size more or less, but the trench increases the cost instead.

SUMMARY OF THE INVENTION

It is therefore an object of the present invention to provide a cost effective chip damage detecting structure, circuit, system or method capable of detecting damage in a chip reliably during operations of a semiconductor integrated circuit.

A semiconductor integrated circuit according to the present invention is formed with a chip check circuit for detecting damage in a chip of said semiconductor integrated circuit. The chip check circuit extends over a predetermined wide area of the chip so as to scan the area, and transmits a signal from an input point to an output point. By monitoring the signal obtained at the output point of the chip check circuit, it is possible to detect damage in the chip. The chip check circuit may comprise one or more semiconductor devices formed in the semiconductor substrate. For example, the semiconductor devices are inverters, and two or more of the inverters are combined with one function circuit of the integrated circuit to form a circuit block. In the circuit block, a chip check signal line extends from one inverter to another inverter so as to scan over the surface of the function circuit. When the integrated circuit is made up of a plurality of such circuit blocks, the inverters of the circuit blocks are connected so as to form the chip check circuit capable of detecting breakages in the entirety of the chip.

BRIEF DESCRIPTION OF THE DRAWINGS

FIG. 1 is a schematic view showing a fail-safe system according to a first embodiment of the present invention.

FIG. 2A is a schematic view showing a fail-safe system according to a second embodiment of the present invention.

FIG. 4A is a sectional view taken across a line 4A—4A in FIG. 3A.

FIG. 10A is a sectional view showing a sectional structure of a semiconductor chip according to a fifth embodiment of the present invention.

DETAILED DESCRIPTION OF THE INVENTION

A first embodiment of the present invention is shown in FIG. 1.

Figure 11:
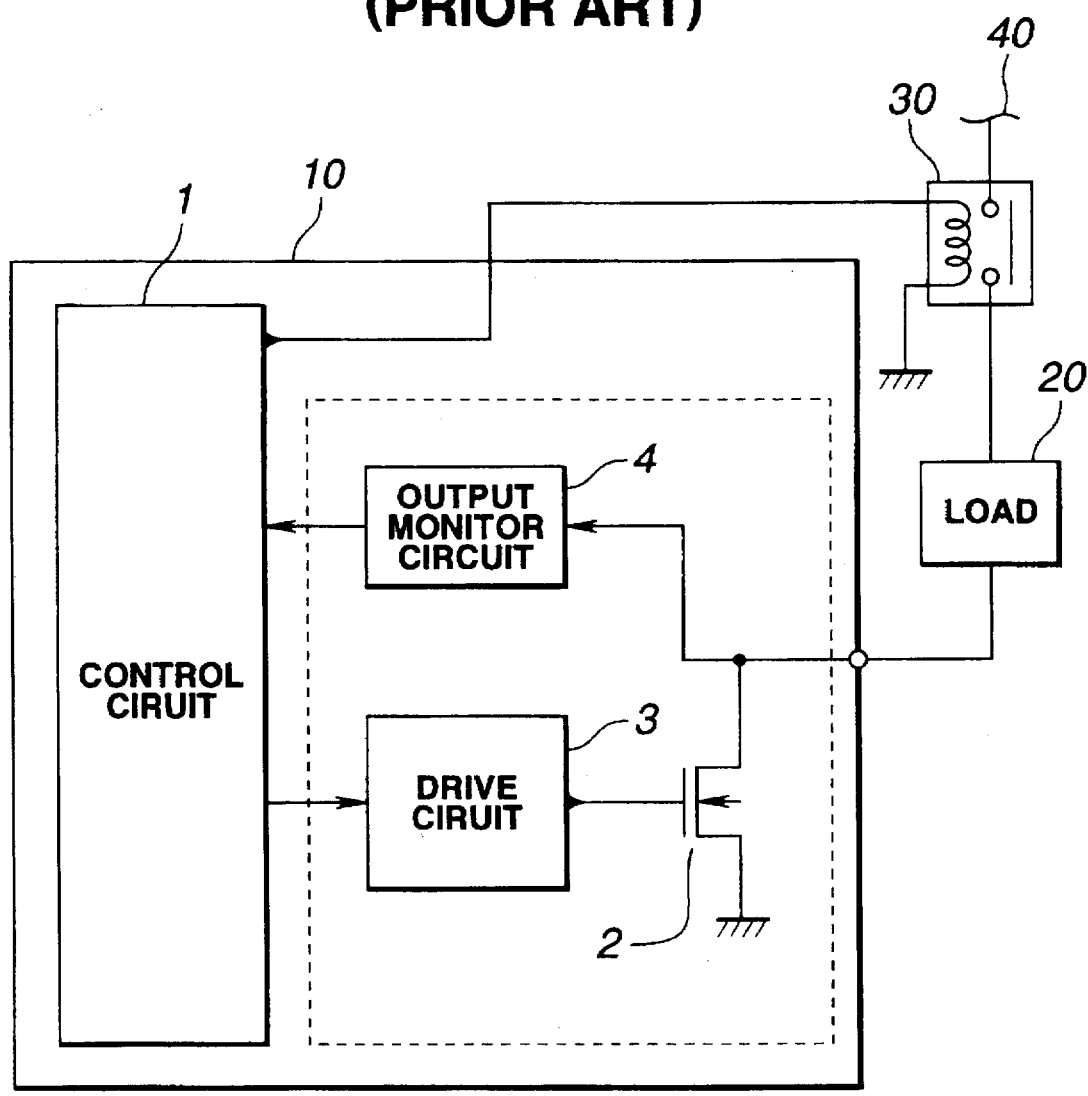
FIG. 11 is a schematic view showing a conventional fail-safe system.
Figure 12A:
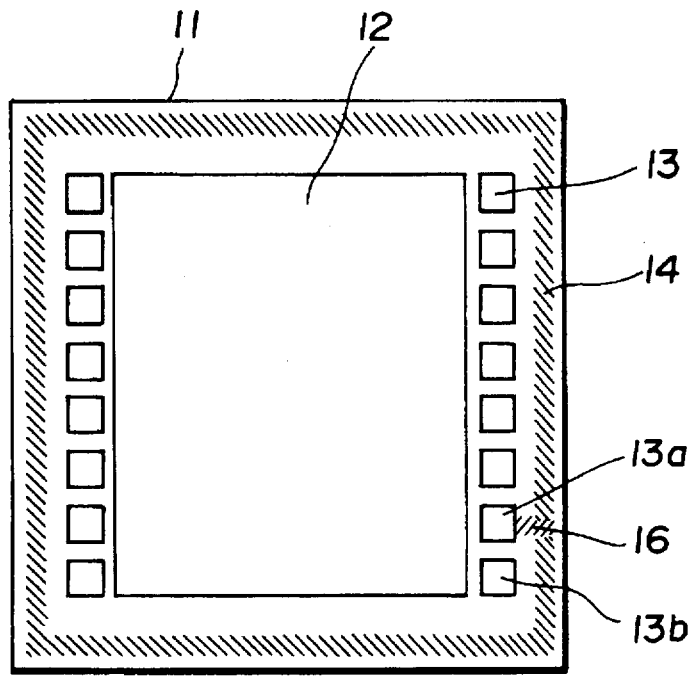
FIG. 12A is a plan view showing a conventional semiconductor chip.
Figure 12B:
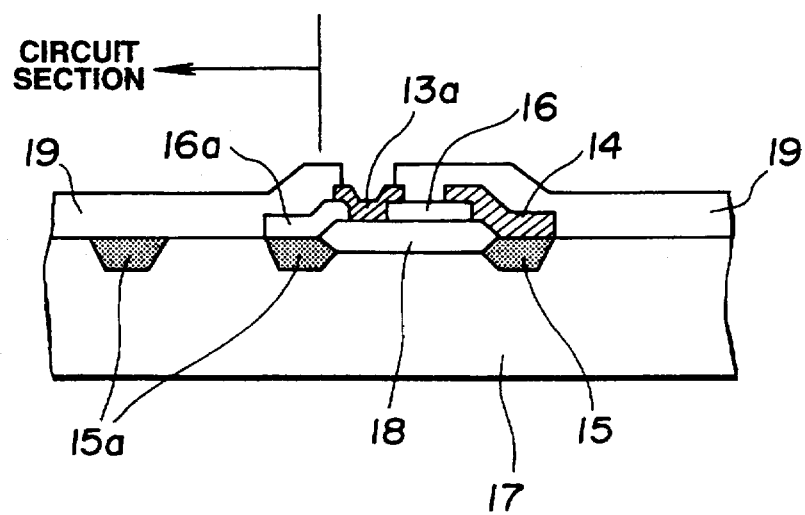
FIG. 12B is a sectional view showing a sectional structure of an inspection pad and its surroundings in the semiconductor chip of FIG. 12A.

A control circuit 50 shown in FIG. 1 is designed to perform a function similar to that of the control circuit shown in FIG. 11.

A semiconductor chip 60 of this example has three channels each performing the functions of the load driving transistor 2, the drive circuit 3 and the output monitor circuit 4 shown in FIG. 11. All the components are integrated in a single chip.

Each of load driving transistors 61, 62 and 63 of the semiconductor chip 60 is substantially identical in construction and function to the load driving transistor 2 shown in FIG. 11. Each of output monitor circuits 64, 65 and 66 is substantially identical to the output monitor circuit 4, and each of drive circuits 67, 68 and 69 is substantially identical to the drive circuit 3 of FIG. 11. The load driving transistors 61, 62 and 63 are connected, respectively, with loads 71, 72 and 73, which are connected through a fail-safe relay 30, with a power supply 40.

A chip check signal is produced by the control circuit 50 and inputted into the semiconductor chip 60. The chip check signal is a periodic signal periodically alternating between an H level and an L level.

A chip damage detecting series line 70 is formed in the semiconductor chip 60. The chip check signal is supplied to the damage detecting series line 70. The detecting series line 70 extends near various circuit blocks formed in the semiconductor chip 60 so as to form a single path for current. In the example shown in FIG. 1, the damage detecting line 70 proceeds with frequent sharp turns so as to cover the entire area of the chip 60, and each of the load driving transistors 61–63, the output monitor circuits 64–66 and the drive circuits 67–69 is surrounded almost completely by segments of the damage detecting line 70. The damage detecting line 70 has a first line end for receiving the chip check signal from the control circuit 50, and a second line end for sending a signal to the control circuit 50. In the example shown in FIG. 1, each of the transistors 61–63 and the circuits 64–69 is in the form of a rectangular block, and one or more straight line segments of the detecting line 70 extends very close along one or more straight sides of each block like a borderline. Each block is bordered or bounded by the damage detecting line 70.

The operation of the circuit shown in FIG. 1 is as follows.

If any one of the circuit blocks in the semiconductor chip 70 is injured by a crack on the chip, burning in the surface, widespread corrosion or some other serious injury, the damage detecting line 70 will be injured together near the injured circuit block with a high probability.

In this case, the damage detecting line 70 becomes unable to transmit the periodic chip check signal properly. This abnormal condition is detected by the control circuit 50 which constantly monitors the period and/or the level of the signal outputted from the damage detecting line 70. Upon detection of the abnormal condition, the control circuit 50 stops the power supply to the loads by opening the fail-safe relay 30 to ensure the safety of the system.

Therefore, the system shown in FIG. 1 can detect an abnormality in the semiconductor chip 60 and take a fail-safe control action even when the semiconductor chip 60 suffers both damage fixing one of the transistors 61–63 in the on state, and damage fixing the corresponding output of the output monitor circuits 64–66 at a value indicating the off state of the load driving transistor. This system can readily detect a failure merely by monitoring the period or level of a signal or some other condition, without requiring any special costly measuring system. This system can reliably detect various damages or breakages in the semiconductor chip 60 with a high probability.

It is possible to form the chip damage detecting line 70 by utilizing a multi-layer structure of aluminum, polysilicon or some other conductive material. Therefore, the increase in chip area and chip cost caused by the addition of the chip damage detecting line 70 is very low and not problematical. The present invention does not require external inspection equipment, and the present invention can increase the accuracy of the inspection without increasing the cost.

The output monitor circuits 64–66 and other conventional damage detecting means formed in a semiconductor chip are effective in detecting a relatively small-scale solitary failure whereas the damage detecting system according to the present invention is effective in detecting a large-scale failure or a plurality of concurrent failures. The combination of both functions can enhance the fail safe performance.

Figure 2B:
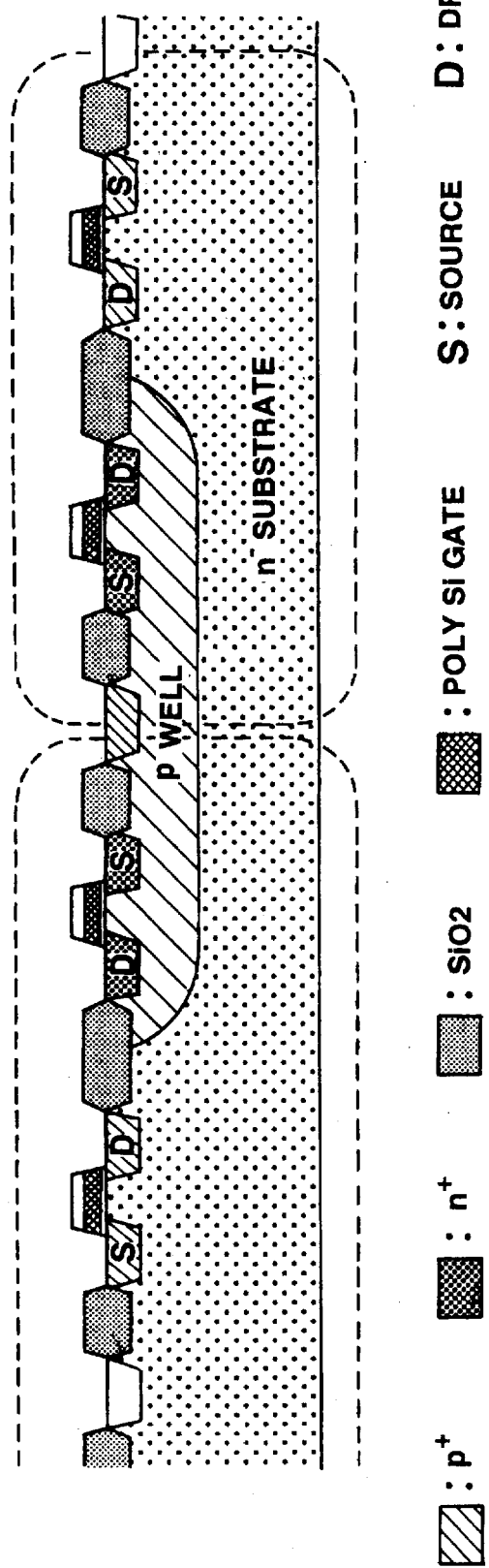
FIG. 2B is a sectional view of a semiconductor integrated circuit, taken across a line 2B—2B in FIG. 2A.

A second embodiment of the present invention is shown in FIGS. 2A and 2B. FIG. 2A schematically shows a system according to the second embodiment, FIG. 2B shows a semiconductor chip 160 in section taken across a line 2B—2B in FIG. 2A. The control circuit 50, loads 71–73, fail-safe relay 30, and power supply 40 are identical to those shown in FIG. 1, and connected in the same manner. Furthermore, the load driving transistors 61–63, output monitor circuits 64–66 and drive circuits 67–69 are identical in construction and interconnection to those shown in FIG. 1.

A chip damage detecting series circuit 170 is formed in the semiconductor chip 160 as shown in FIG. 2A. The damage detecting series circuit 170 is almost the same as the damage detecting line 70 shown in FIG. 1, but the damage detecting series circuit 170 further includes a plurality of inverter circuits inserted in the line at different positions. The chip damage detecting line 70 is formed above the semiconductor substrate surface whereas each of the inverter circuits distributed along the chip damage detecting series circuit 170 comprises active regions formed in the semiconductor substrate and extending into the semiconductor substrate from the semiconductor substrate surface. The inverter circuits therefore cease the normal operation upon occurrence of injuries in pn junctions and wells, injuries in gate oxide films in the case of the inverter circuit employing the MOS transistor structure, and other three dimensional injuries extending into the semiconductor structure.

As shown in FIG. 2A, each inverter circuit has input and output terminals, and the output terminal of each inverter circuit except the last one is connected by a conductive chip check line segment to the input terminal of the next inverter circuit.

In the example shown in FIG. 2B, the semiconductor chip has the MOS structure. FIG. 2B shows one inverter by a broken line rectangle on the right side of FIG. 2B, and a portion of the drive circuit 69 on the left. If, for example, a portion of the drive circuit (69) is broken, and an abnormal condition occurs in the pn junction formed by a p well (at a ground potential) and an n substrate (at a supply potential), then the pn junction suffers leakage and the p well potential becomes abnormal. This abnormalizes the operation of the adjacent inverter of the chip damage detecting series circuit 170 because the dajacent inverter shares the p well with the drive circuit. As a result, the damage detecting series circuit 170 becomes unable to transmit the chip check signal correctly. The normal transmission of the chip check signal is disrupted not only by such abnormality in the p well potential, but also by abnormal conditions in the gate, source or drain of the inverter or in surrounding interconnection.

The chip damage detecting line 70 according to the first embodiment can detect two dimensional breakage on the semiconductor chip 70 whereas the chip damage detecting series circuit 170 according to the second embodiment can further detect three dimensional breakage extending into the semiconductor structure with the circuit components arranged in series in the detecting circuit 170. The second embodiment can improve the reliability and accuracy of the breakage detection.

In the example shown in FIGS. 2A and 2B, the inverter circuits are employed in the damage detecting series circuit 170. It is however optional to employ other circuit components in place of the inverter circuits. For example, a plurality of two-terminal components each having input and output terminals are conected in series so that the output terminal of one is connected to the input terminal of the next.

A third embodiment of the present invention is shown in FIGS. 3A–3D and FIGS. 4A and 4B. In the third embodiment, one or more conductive lines for the chip damage detection are formed on at least one of cells or blocks constituting the circuitry in the semiconductor chip.

In general, the electrical interconnection of integrated components in the semiconductor chip is achieved by forming a plurality of layers of polysilicon or metal at different levels. In such a multi-layer structure, an interlayer insulating film such as a $SiO_2$ film is sandwiched between two conductive layers to electrically separate the conductive layers. In the following explanation, a plurality of overlapping conductive layers or lines are separated by one or more intervening insulating layers unless stated otherwise.

Figure 3A:
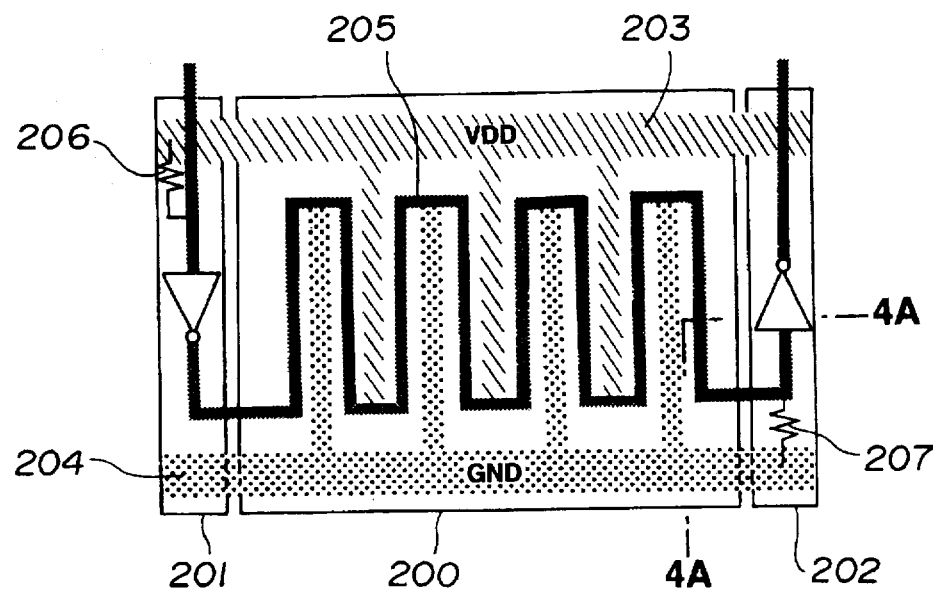
FIG. 3A is a schematic view showing one circuit block according to a first example of a third embodiment of the present invention

FIG. 3A shows one circuit cell or block. A functional circuit cell 200 is a circuit of an appropriately chosen size. For example, the function circuit cell 200 shown in FIG. 3A may be the output monitor circuit 64 or may be one of sections constituting the output monitor circuit 64. Near the functional circuit cell 200, there are formed first and second inverter cells 201 and 202 which are components of a chip damage detecting series circuit similar to the series circuit 170 according to the second embodiment. A cell check line 205 connecting the inverters of the inverter cells 201 and 202 is formed on the functional circuit cell 200 so as to sweep all over the functional cell 200. A power supply line 203 and a ground line 204 are formed on the functional circuit cell 200 and the inverter cells 201 and 202. Each of the supply line 203 and the ground line 204 has a plurality of fingers extending near the cell check line 205. A pull-up resistor 206 is connected with an input portion of the inverter cell 201, and a pull-down resistor 207 is connected with an input portion of the inverter cell 202.

In the example shown in FIG. 3A, the first and second inveter cells 201 and 202 and the function circuit cell 200 formed between the inverter cells 201 and 202 constitute a composite circuit cell. The cell check line 205 extends from the output point of the first inverter cell 201 to the input point of the second inverter cell 202, proceeding back and forth so as to form a rectangular waveform between the supply and ground lines 203 and 204

FIG. 4A shows the sectional structure taken across a line 4A—4A in FIG. 3A. The inverter cell 202 shares a p well region with the functional circuit cell 200. Portions of the cell check line 205 and the ground line 204 are proximately formed on an insulating film 208 in the area of the functional circuit cell 200. The ground line 204 is connected to the p well to hold the potential of the p well at the ground level. The n substrate is biased to the supply potential.

Figure 3B:
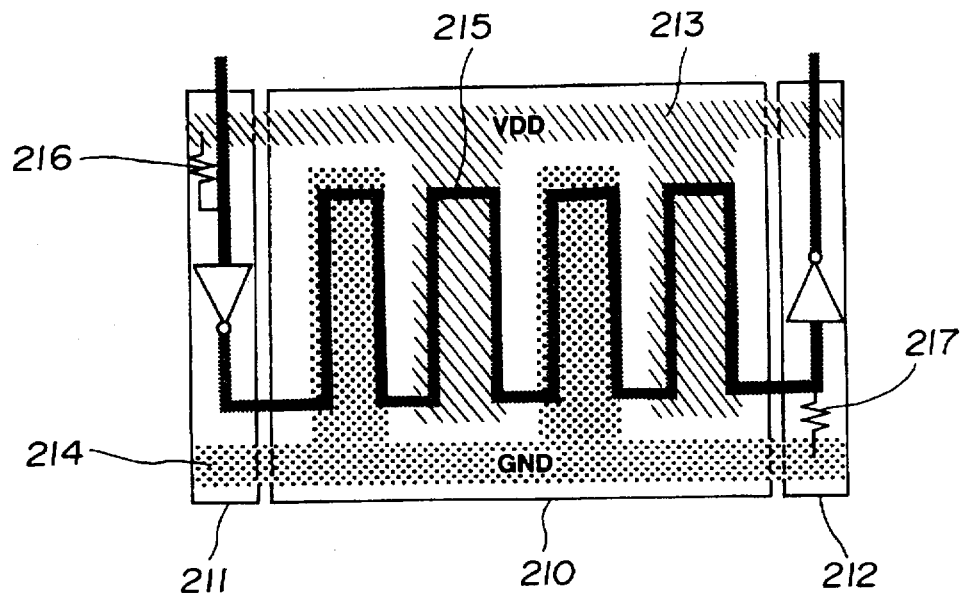
FIGS. 3B, 3C and 3D are schematic views similar to FIG. 3A, but showing circuit blocks according to second, third and fourth examples of the third embodiment, respectively.

FIG. 3B shows another example according to the third embodiment. There are provided a functional circuit cell 210, inverter cells 211 and 212, a supply line 213, a ground line 214, a cell check line 215, a pull-up resistor 216 and a pull-down resistor 217 like the example of FIG. 3A. In the example of FIG. 3B, each of the supply line 213 and the ground line 214 has fingers overlapping the cell check line 215. In the example shown in FIG. 3B, there are formed, in the area of each finger, one short straight line segment of the cell check line 215, and two parallel long straight line segments extending from both ends of the short segment in the same direction.

Figure 3C:
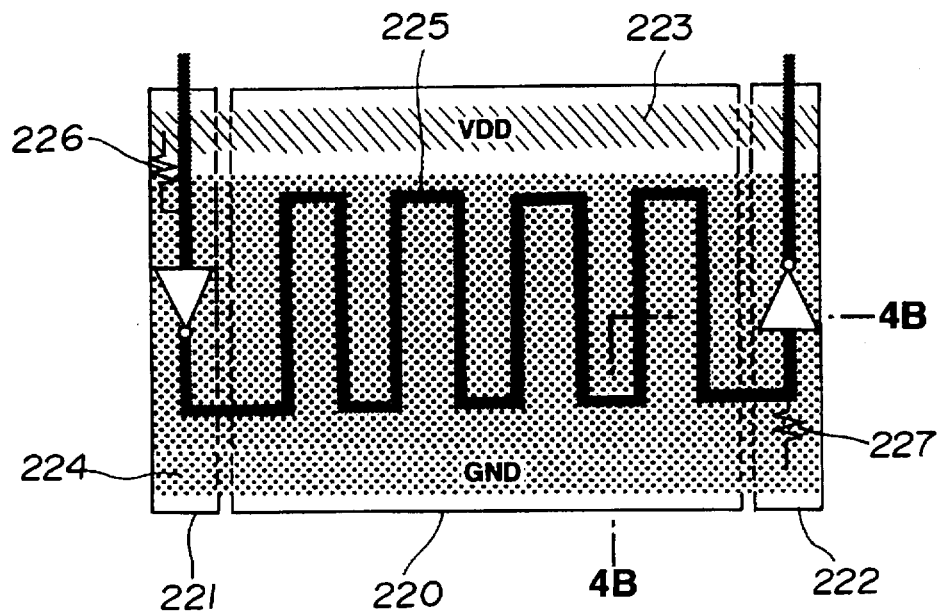

FIG. 3C shows still another example, according to the third embodiment, which is almost identical to the examples of FIGS. 3A and 3B. In the example of FIG. 3C, a ground line 224 is wide and covers most of a function circuit cell 220, and inverter cells 221 and 222. The wide ground line 224 entirely overlaps a cell check line 225 between both inverters.

Figure 3D:
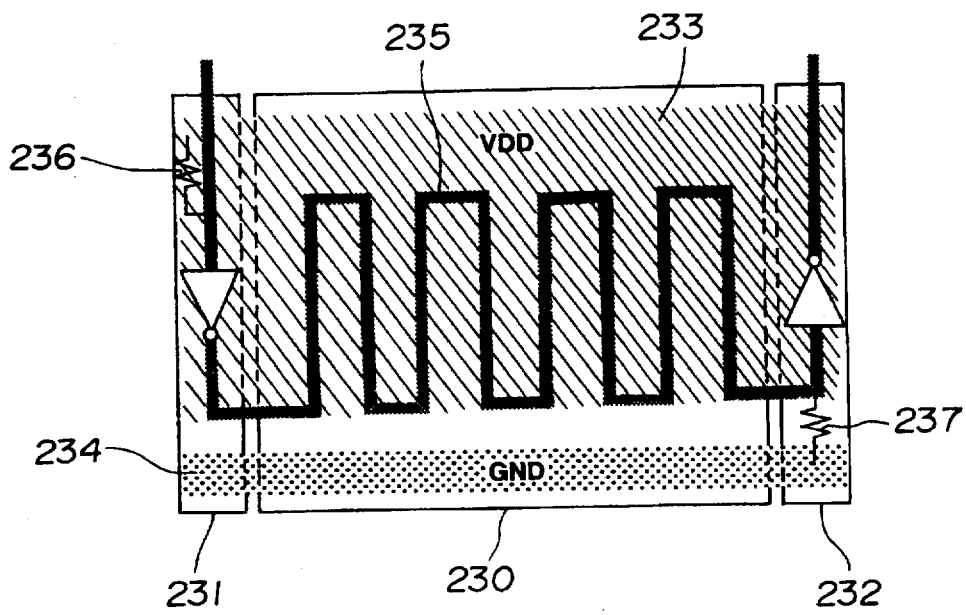

FIG. 3D shows still another example according to the third embodiment, which is almost identical to the preceding examples of FIGS. 3A–3C. In the example of FIG. 3D, a supply line 233 is wide and covers most of a function circuit cell 230, and inverter cells 231 and 232. The wide supply line 233 entirely overlaps a cell check line 235 between both inverters.

Figure 4B:
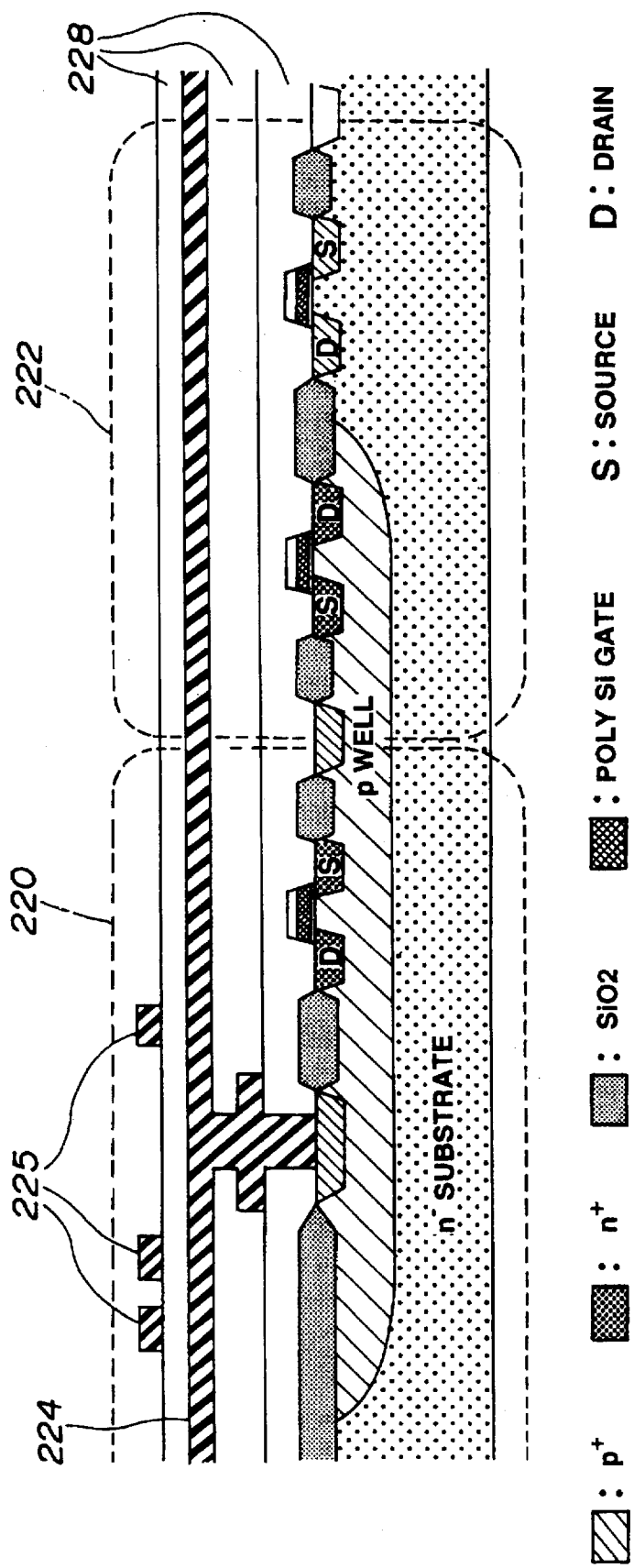
FIG. 4B is a sectional view taken across a line 4B—4B in FIG. 3C.

FIG. 4B shows the sectional structure taken across a line 4B—4B in FIG. 3C. The inverter cell 222 shares a p well with the functional circuit cell 220. In the example of FIG. 4B, the ground line 224 is sandwiched between upper and lower insulating films 228, and the cell check line 225 is formed on the upper insulating film 228. The cell check line 225 overlaps the ground line, and is separated from the ground line 224 by the intervening insulating film 228. The ground line 224 is connected to the p well to hold the potential of the p well at the ground level. The n substrate is biased to the supply potential.

The circuits in the semiconductor chip are formed by using a plurality of circuit cells or blocks each having the construction according to one of the examples shown in FIGS. 3A–4B. Between two consecutive composite circuit cells, the inverter of the second inverter cell of the preceding composite cell is connected to the inverter of the first inverter cell of the following composite cell. The inverters are all connected in series to form the chip damage detecting series circuit similar to the series circuit 170 according to the second embodiment.

In the first and second embodiments, the chip damage detecting series circuit (or line) is extended around the circuit cells. In the third embodiment, the chip damage detecting series circuit extends into the area of each cell, and detects faults in the chip more reliably and accurately. In the examples shown in FIGS. 3A–4B, the supply line or the ground line is arranged in close vicinity to the cell check line of the chip damage detecting series circuit, or directly above or below the cell check line, and the pull-up or pull-down resistor is connected to the input of each inverter, or at least one inverter, of the damage detecting series circuit. With these arrangement, a breakage of one of the functional circuit cells is more likely to cause a breakage in the damage detecting series circuit, which can fix its own output level more reliably, so that the control circuit can make a more reliable and accurate judgment about the output signal from the damage detecting circuit.

In the first, second and third embodiments, the chip damage detecting series circuit is formed by only one signal line. In the present invention, it is possible to provide a plurality of chip damage detecting series circuits, and deliver, from the control circuit, a non-sequential signal such as a two-wire logic code. In the case of the non-sequential code, the signal is normally in the form of a code signal, but changed to a non-code word if the chip damage detecting series circuits suffer a breakage or failure. Therefore, the system can detect breakage or failure by checking the change of the signal to the non-code. In this case, it is not always necessary-to employ a periodic signal as the signal supplied from the control circuit, so that the signal generation and signal monitoring sections in the control circuit can be simplified.

A fourth embodiment of the present invention is shown in FIGS. 5A, 5B, 6A and 6B. The fourth embodiment relates to a two wire logic circuit known to be effective in detecting failures in a circuit, and implements the detectability equal to that of the conventional two wire logic circuit by using the arrangement of cell check lines shown in the third embodiment without increasing the scale of the circuit so much. In the conventional two wire logic circuit, the scale of the circuit is doubled whereas the circuit scale according to the fourth embodiment is equal to that of the ordinary one wire logic circuit.

Figures 13A, 13B:
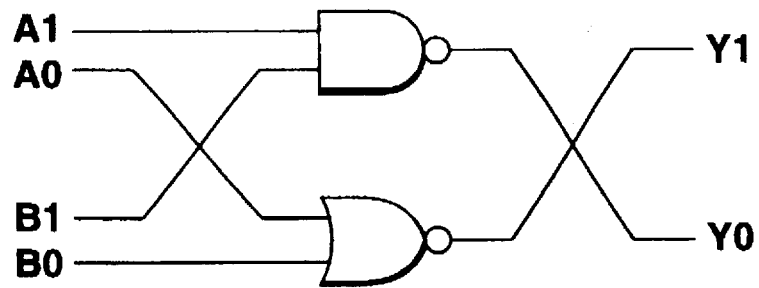
FIG. 13A is a diagram showing a two-wire type conventional logic product gate circuit.
FIG. 13B is a truth table of the gate circuit of FIG. 13A.

FIG. 13A shows an AND gate of the conventional two-wire logic circuit, and FIG. 13B shows its truth table. Each of two input signal pairs (A1, A0) and (B1, B0) is a two wire logic code, and the logical product of these is outputted as a two-wire logic output signal pair (Y1, Y0). This circuit is symmetrically arranged about the two inputs, so that the arrangements in which the two input signal pairs are exchanged is logically equivalent to the original arrangement. This relationship is shown in the truth table of FIG. 13B. If, because of occurrence of a single stuck fault (or stuck-at fault), a non-code signal is inputted, a non-code signal appears also at the output before generation of a wrong output signal. This nature enables detection of circuit fault. The two wire logic circuit comprised of a combination of such logic gates is double in the circuit scale or size as compared to the conventional circuit. In the case of the single stuck fault signal being inputted, the output pair is (0, 0) or (1, 1) as shown in the truth table of FIG. 13B.

Figure 5A:
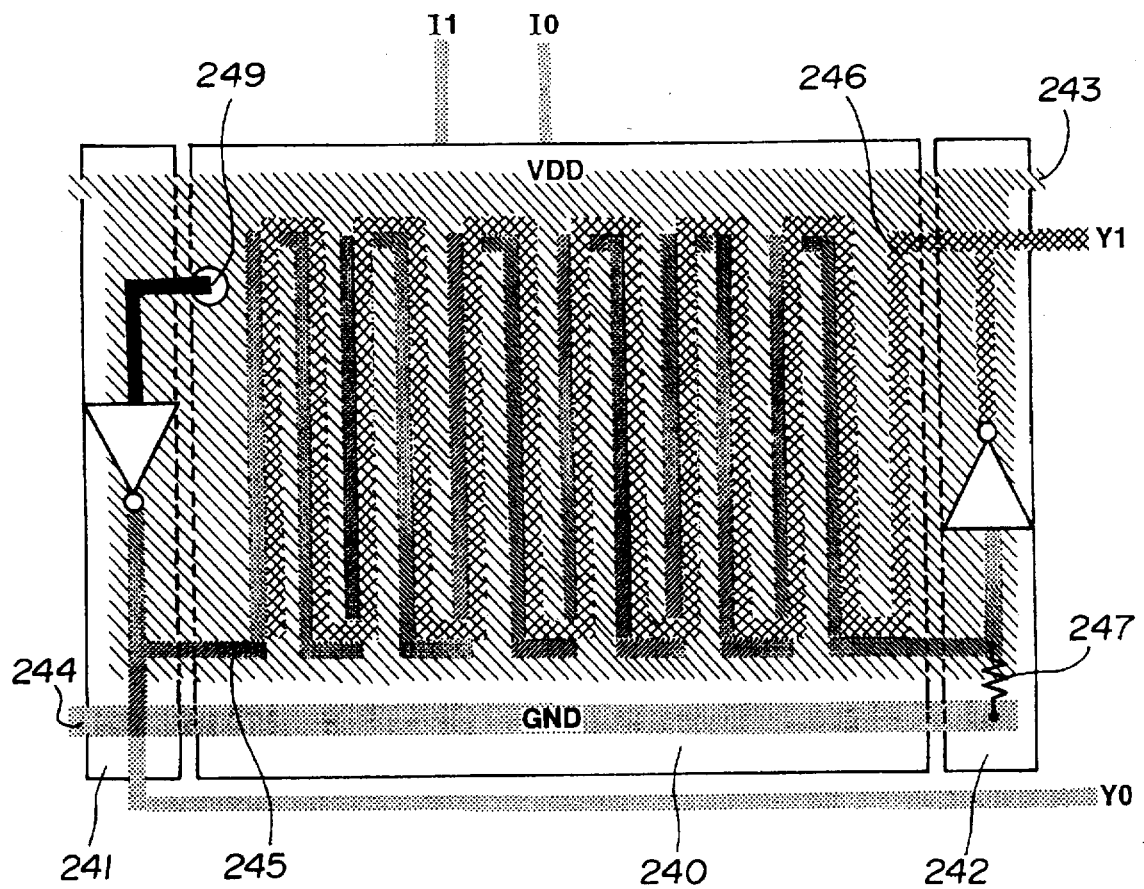
FIG. 5A is a schematic view showing one circuit block according to a first example of a fourth embodiment of the present invention.
Figure 5B:
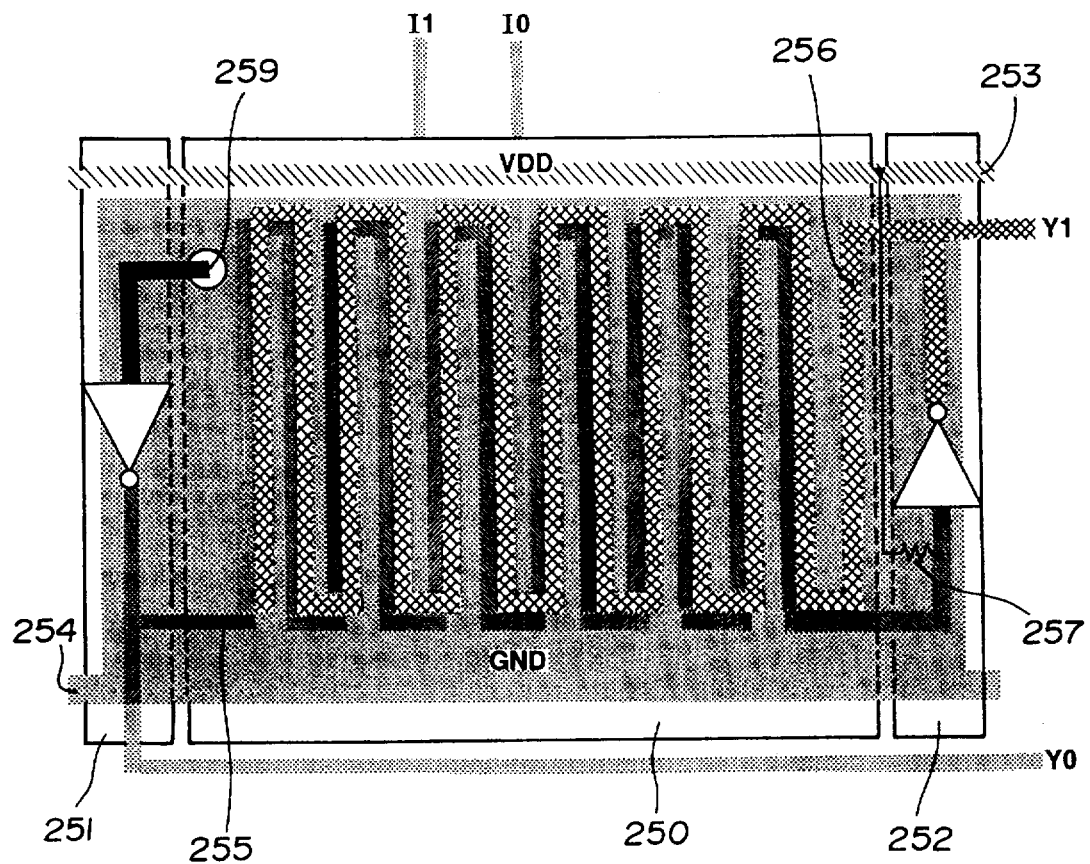
FIG. 5B is a schematic view showing one circuit block according to a second example of the fourth embodiment of the present invention.

The entire circuit in the semiconductor chip according to the fourth embodiment is constituted by a plurality of circuit cells or blocks formed as shown in FIG. 5A or 5B. Unlike the preceding embodiments, in the illustrated examples of the fourth embodiment, there is no need for the input signal to the chip damage detecting series circuit from the control circuit or some other circuit external to the semiconductor chip.

A functional circuit cell 240 shown in FIG. 5A is a circuit having a function on an appropriately chosen scale. The functional circuit cell 240 may be a small-scale circuit or may be a large-scale function block. In this example, the functional circuit cell 240 is placed between first and second inverter cells 241 and 242 adjacent to the function circuit cell 240, as in the examples according to the third embodiment. The input of the first inverter cell 241 is connected with an output point 249 of the function circuit cell 240 through a contact hole formed in one or more layers in a multi-level interconnection structure so that the first inverter cell 241 receives an output signal of the function circuit cell 240. A supply line 243 has a wide segment expanding almost over the entirety of the function circuit cell 240 and the first and second inverter cells 241 and 242. The output of the first inverter cell 241 is connected to the input of the second inverter cell 242 through a first cell check line 245 extending back and forth all over the function circuit cell 240. Furthermore, the output of the first inverter cell 241 is delivered as an output signal Y0. The output signal of the second inverter cell 242 is outputted as a signal Y1, and simultaneously the output of the second inverter cell 242 is connected with a second cell check line 246 extending back and forth all over the function circuit cell 240 and overlapping the first cell check line 245. A pull-down resistor 247 is connected between the input of the second inverter cell 242 and a ground line 244. In this arrangement, the output of the function circuit cell 240 is seemingly outputted as a two wire logic code, in the form of the pair of the output signals Y1 and Y0. Signal lines I1 and I0 are input signal lines to the functional circuit cell 240, and the pair of the signals on the input signals lines I1 and I0 constitutes a two wire logic code.

An example shown in FIG. 5B is almost the same as the example of FIG. 5A. The example of FIG. 5B is different from FIG. 5A only in that a ground line 254 shown in FIG. 5B is wide and covers almost the entirety of a function circuit cell 250, and first and second inverter cells 251 and 252, and that a pull-up resistor 257 is connected to the input of the second inverter cell 252.

Figure 6A:
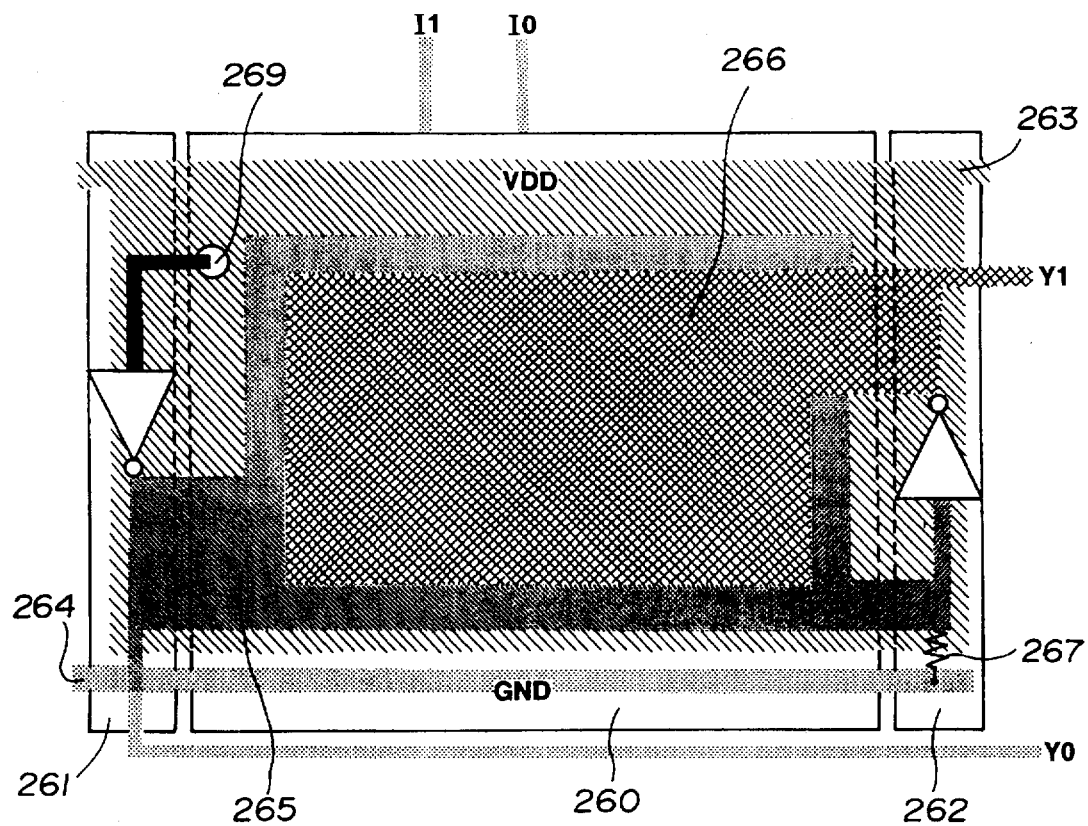
FIG. 6A is a schematic view showing one circuit block according to a third example of the fourth embodiment of the present invention.
Figure 6B:
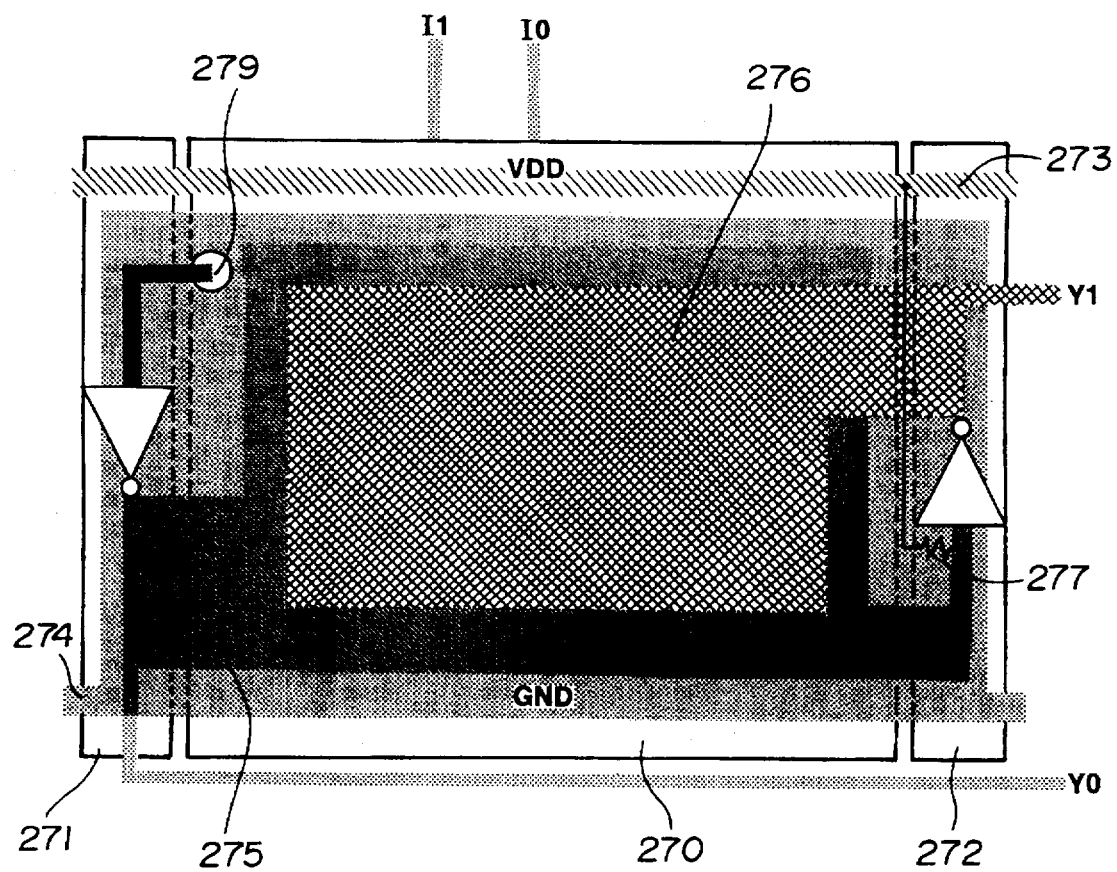
FIG. 6B is a schematic view showing one circuit block according to a fourth example of the fourth embodiment of the present invention.

An example shown in FIG. 6A is almost the same as the example of FIG. 5A, but different in the following point. A first cell check line 265 connecting first and second inverter cells 261 and 262 and a second cell check line 266 which is the output of the second inverter cell 262 are both expanded to cover a function circuit cell 260. The supply line 263 and first and second signal lines 265 and 266 have the respective wide segments overlapping one another at three different electrically separated levels. Similarly, an example shown in FIG. 6B is almost the same as the example of FIG. 5B, but different in that a first cell check line 275 connecting first and second inverter cells 271 and 272 and a second cell check line 276 which is the output of the second inverter cell 272 are both expanded to cover a function circuit cell 260.

Figures 7A, 7B:
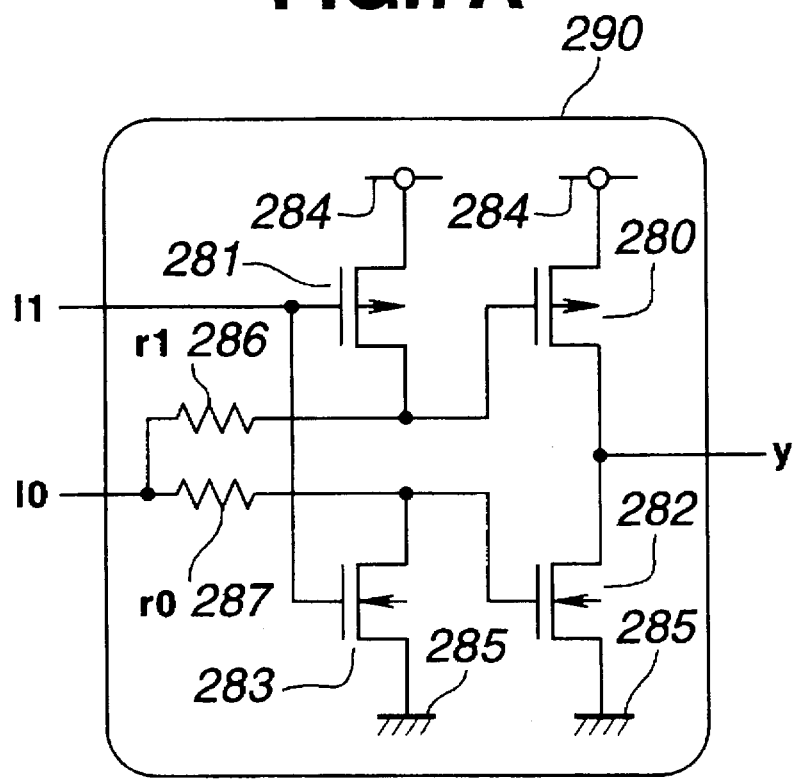
FIG. 7A is a MOS type logic converting buffer circuit according to the fourth embodiment of the present invention.
FIG. 7B is a table listing possible input combinations and corresponding outputs of the buffer circuit of FIG. 7A.

In each of the examples shown in FIGS. 5A–6B, the internal circuit in the function circuit cell 240, 250, 260 or 270 has an ordinary one-wire type logic circuit configuration different from the two-wire logic circuit. The functional circuit cell has a logic converting buffer circuit for receiving the two-wire type code signal pair I1 and I0 and delivering a signal to the internal circuit. FIGS. 7A and 7B show one example of the logic converting buffer circuit.

The logic converting buffer circuit 290 shown in FIG. 7A comprises P channel MOS transistors 280 and 281 whose sources are connected to a power supply line 284; N channel MOS transistors 282 and 283 whose sources are connected to a ground line 285; and resistors r1 (286) and r0 (287).

The input signal I1 is connected to the gates of the P channel MOS transistor 281 and the N channel MOS transistor 283, and the input signal I0 is connected to ends of the resistors r1 (286) and r0 (287). The other end of the resistor r1 (286) is connected to the drain of the P channel MOS transistor 281, and the gate of the P channel MOS transistor 280. The other end of the resistor r0 (287) is connected to the drain of the N channel MOS transistor 283 and the gate of the N channel MOS transistor 282. The drains of the P channel MOS transistor 280 and the N channel MOS transistor 282 are connected together to an output end for delivering an output signal y.

The table of FIG. 7B lists possible combinations of the input signals and the corresponding states of the output signal. When the input signal pair (I1, I0)=(1, 0) representing a logic one is inputted, then the output becomes one, that is y=1. In response to the input signal pair (I1, I0)=(0, 1) representing a logic 0, the buffer circuit 290 provides the output y=0. Each of the combinations (I1, I0)=(1, 1) and (I1, I0)=(0, 0) is non-code. In response to these non-code inputs, the output y goes to a high impedance state Z.

The operation of the logic converting buffer circuit 290 will be explained more in detail for each of the possible input pairs.

(1) (I1, I0)=(1, 0)

In this case, the P channel MOS transistor 281 turns off, and the N channel MOS transistor 283 turns on. Therefore, the P channel MOS transistor 280 receives, at its gate, the input I0 (=0) through the resistor r1 (286), and turns on. The N channel MOS transistor 282 turns off with the gate at the ground level. As a result, the output becomes y=1.

(2) (n, I0)=(0, 1)

The P channel MOS transistor 281 turns on, and the N channel MOS transistor 283 turns off. Therefore, the P channel MOS transistor 280 receives, at its gate, the signal of the logic one, and turns off. The N channel MOS transistor 282 receives, at the gate, the signal I0 (=1) through the resistor r0 (287), and turns on. As a result, the output becomes y=0.

(3) (n, I0)=(0, 0)

The P channel MOS transistor 281 turns on, and the N channel MOS transistor 283 turns off. Therefore, the P channel MOS transistor 280 receives, at its gate, the signal of the power supply level (=1) through the P channel MOS transistor 281, and turns off. In this case, the signal I0 is equal to zero (I0=0), and current flows from the supply line 284 through the P channel MOS transistor 281 and the resistor r1 (286) to the part of the signal I0. However, the resistor r1 (286) of an appropriately adjusted resistance can hold the gate potential of the P channel MOS transistor 280 at the logic one, and hold the input I0 equal to zero (I0=0). The N channel MOS transistor 282 receives, at the gate, the signal of the logic zero, and turns off. As a result, the output y turns to the high impedance state.

(4) (I1, I0)=(1, 1)

The P channel MOS transistor 281 turns off, and the N channel MOS transistor 283 turns on. Therefore, the P channel MOS transistor 280 receives, at its gate, the signal of the input I0 (=1) through the resistor r1 (286), and turns off. The N channel MOS transistor 282 receives, at its gate, the signal of the ground level (=0) through the N channel MOS transistor 283, and turns off. In this case, the signal I0 is equal to one (I0=1), and current flows from the part of the input I0 through the resistor r0 (287) and the N channel MOS transistor 283 to the ground line 285. However, the resistor r0 (287) of an appropriately selected resistance can hold the gate potential of the N channel MOS transistor 282 at the logic zero, and hold the input I0 equal to one (I0=1). As a result, the output y turns to the high impedance state.

The output of the buffer circuit 290 is brought to the high impedance state when the input two-wire logic code is a non-code because of an abnormal condition in the circuit which has generated the input signal. In this case, it is possible to handle the high impedance state by adding a pull-up or pull-down device such as a resistor at the output of the logic converting buffer circuit 290. It is possible to choose one of the pull-down and the pull-up devices according to the convenience of the application. When, for example, this embodiment is applied to the drive circuit 3 in the control system shown in FIG. 11, the level is determined so as to turn off the load driving transistor 2. In the case of an N channel MOS transistor, for example, a pull-down resistor is connected to the gate.

Figure 8:
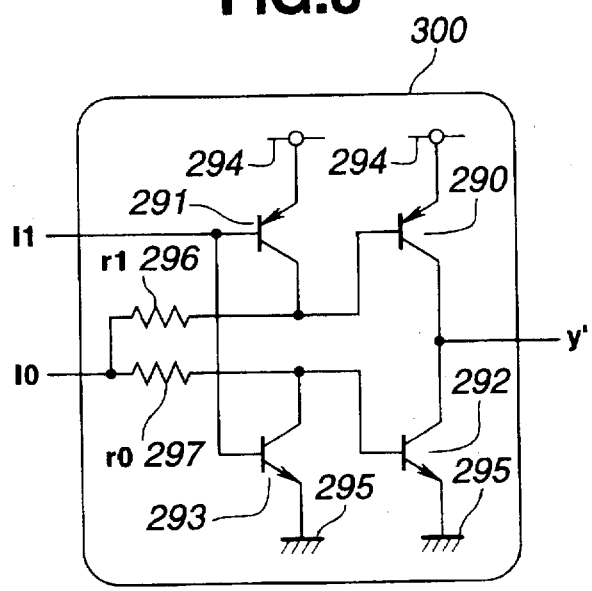
FIG. 8 is a bipolar type logic converting buffer circuit according to the fourth embodiment of the present invention.

FIG. 8 shows another example of the logic converting buffer circuit. The logic converting buffer circuit 300 shown in FIG. 8 employs bipolar transistors instead of the MOS transistors of the example shown in FIG. 7A. The logic converting buffer circuit 300 shown in FIG. 8 comprises PNP transistors 290 and 291 whose emitters are connected to a power supply line 294; NPN transistors 292 and 293 whose emitters are connected to a ground line 295; and resistors r1 (296) and r0 (297). The bipolar buffer circuit 300 is operated substantially in the same manner as the MOS buffer circuit 290.

For example, the entire circuitry in the semiconductor chip is formed by using a plurality of the thus-constructed circuit cells or blocks, and connecting the output pair (Y1, Y0) of one of the circuit cells to the input pair (I1, I0) of another circuit cell. When the signal inputted from the outside of the semiconductor chip is not a two-wire logic code, but a normal one-wire logic code, the logic converting buffer circuit is not required in the function circuit cell receiving this signal in the semiconductor chip.

The system according to the fourth embodiment is operated as follows.

When, in the semiconductor chip constituted by cells or blocks constructed as shown in FIGS. 5A–6B, the function circuit cell 240, 250, 260 or 270 of one unit cell is broken for some reason, at least one of the first and second cell check lines on the cell is simultaneously broken with a high probability. In the configuration of FIG. 5A, for example, in which the first and second cell check lines 245 and 246 and the supply line 243 overlap one another, such a breakage may cause a short circuit in the multi-layer interconnection structure of these overlapping lines, and the potential of each cell check line 245 or 246 will be changed to the level of the power supply with a high probability. In this case, the output signal pair Y1 and Y0 goes to the state of (Y1, Y0)=(1, 1). Even when the short circuit is only between the cell check lines 245 and 246, the output signals Y1 and Y0 become equal to each other (Y1=Y0), resulting in the non-code signal.

When only one of the cell check lines 245 and 246 is short-circuited with the supply line 243, and fixed at the logic one, the circuit will output the non-code signal during a change of the signal of the function circuit cell 249. In the multi-level structure having the first cell check line 245 formed in the lower level above the function circuit cell 240, the second cell check line 246 formed in the intermediate level above the first cell check line 245 and the supply line 243 formed in the upper level above the second cell check line 246, for example, the possibility of a short circuit of the cell check line 245 with the supply line 243 is low.

When the cell check line 245 and the cell check line 246 are broken, the output Y1 of the inverter cell 242 is fixed at the logic one by the pull-down resistor 247 connected to the input of the inverter cell 242. While the signal Y0 varies in accordance with the value of the output 249 of the function circuit cell 240, the two-wire logic output (Y1, Y0) does not come to (0, 1) representing the logic zero because the output signal Y1 is fixed at Y1=1. Furthermore, the circuit will produce the non-code signal with a high probability during a change in the signal of the function circuit cell output 249. By using a pull-up resistor instead of the pull-down resistor 247, it is possible to arrange the circuit so that the output Y1 is fixed at Y1=0, and the logic output (Y1, Y0) does not become equal to (1, 0) representing the logic one.

The example of FIG. 5B is operated likewise. In the example of FIG. 5A, the cell check line potential is changed to the power supply level by an occurrence of short-circuit between two signal lines as explained above. In the example of FIG. 5B, however, the cell check line potential is changed to the ground level. When the cell check lines 255 and 256 are broken, the output signal Y1 of the second inverter cell 252 is fixed at the logic zero by the pull-up resistor 257 connected with the input of the inverter cell 252, and therefore, the output pair does not become (1, 0). In other respects, the example of FIG. 5B is operated substantially in the same manner as in the example of FIG. 5A. The examples of FIGS. 6A and B are operated substantially in the same manner. A breakage of the function circuit cell 260 or 270 will cause a short circuit between the cell check lines and the supply line or the ground line with a high probability, and the output pair (Y1, Y0) will become the non-code signal.

As explained above, each of the examples of FIGS. 5A, 5B, 6A and 6B is so arranged that, on the occurrence of injury in the circuit cell, the two-wire logic coded output pair (Y1, Y0) becomes the non-code signal state, or does not become a predetermined logic value (logic one or zero) with a high probability.

In the thus-arranged semiconductor chip, the conversion between two-wire logic and one-wire logic is performed only in the input and output portions of a circuit block of any size. Therefore, it is possible to utilize the damage detecting capability of the two-wire logic code without increasing the circuit scale twice as in the conventional two-wire logic circuit.

Figure 9:
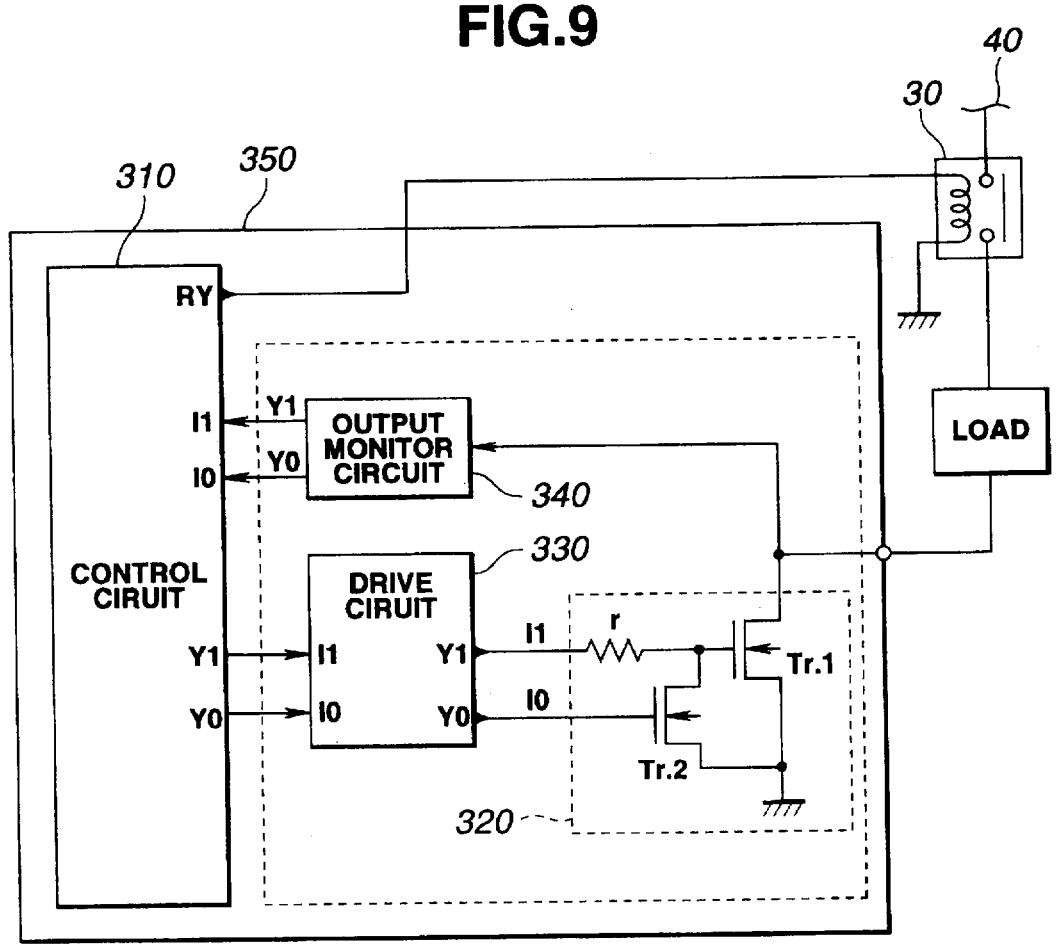
FIG. 9 is a schematic view showing a fail-safe system according to the fourth embodiment of the present invention.

FIG. 9 shows an example in which the circuit cell configuration having the two-wire logic code output and input according to the fourth embodiment is applied to the conventional control system shown in FIG. 11.

In the example of FIG. 9, a drive circuit 330 and an output monitor circuit 340 are both formed by the circuit cell structure according to the fourth embodiment. A load driving transistor circuit 320 employs the logic converting buffer circuit 290 shown in FIG. 7A arranged in the form of an open drain type. The drive circuit 330, the output monitor circuit 340 and the load driving transistor circuit 320 are all integrated in a single semiconductor chip.

A control circuit 310 may be arranged by using the circuit cell arrangement according to the fourth embodiment, or may comprise a commercially available microcomputer or ordinary circuitry. In any case, the control circuit 310 of this example is arranged to deliver a two-wire logic coded, load driving command signal (Y1, Y0). The control circuit 310 of this example commands the driving of a load by sending the command signal in the state of (Y1, Y0)=(1, 0). The control circuit 310 further has input terminals (I1, I0) for receiving an output signal (Y1, Y0) of the output monitor circuit 340.

The drive circuit 330 of this example has a circuit cell for generating an output signal (Y1, Y0) of the drive circuit 330, and this output generating circuit cell employs the circuit cell structure according to the example of FIG. 5B. The drive circuit 330 is thus arranged so that the output (Y1, Y0) is prevented from becoming (1, 0) when an injury occurs in the inside of the drive circuit 330. Furthermore, in order for the output (Y1, Y0) to be (0, 1) when the input signal (I1, I0) is any of (0, 1), (1, 1) and (0, 0), the input signal (I1, I0) is supplied to a circuit utilizing a pull-down configuration of the logic converting buffer circuit 290 of FIG. 7A in which the output of the circuit 290 is pulled down.

The load driving transistor circuit 320 has transistors Tr.1 and Tr.2, and a resistor r. Only when the input (I1, I0) is (1, 0), that is, (I1, I0)=(1, 0), the Tr.1 is on and Tr.i2 is off, and the transistor circuit 320 drives the load 20. When (I1, I0) is (0, 1) or (1, 1) or (0, 0), the gate of Tr.1 is at the ground level, so that the load 20 is not driven.

The output monitor circuit 340 has an input terminal connected with the drain terminal of Tr.1, and monitors the voltage. The output signal (Y1, Y0) of the output monitor circuit 340 is (1, 0) to indicate that the drain voltage of Tr.1 is higher than a predetermined value, that is Tr.1 is in the off state. On the other hand, the output signal (Y1, Y0) of (0, 1) indicates that Tr.1 is in the on state and the drain voltage of Tr.1 is lower than the predetermined value. The output monitor circuit 340 comprises an output generating circuit cell for generating the output (Y1, Y0) of the output monitor circuit 340. In this example, the output generating circuit cell of the output monitor circuit 340 employs the circuit cell configuration shown in FIG. 5B. When a breakage occurs in the output monitor circuit 340, the output of the monitor circuit 340 does not go into the state of (1, 0) indicating the off state of Tr.1.

The system shown in FIG. 9 is operated as follows.

(1) When only the drive circuit 330 suffers an injury:

When an injury occurs in the drive circuit 330, the output (Y1, Y0) of the drive circuit 330 will come to the non-code state of (0, 0) or will not become (1, 0) with a high probability. Therefore, the load driving transistor circuit 320 does not turn on, and does not drive the load 20. The control circuit 310 can detect this abnormal condition by monitoring the output (Y1, Y0) of the monitor circuit 340 because the output (Y1, Y0) of the monitor circuit 340 does not go to the state of (0, 1) indicating the on state of the load driving transistor circuit 320 and the lowering of the drain potential toward the ground level notwithstanding an attempt of the control circuit 310 to drive the load 20. Therefore, the control circuit 310 can turn off a fail-safe relay 30 or perform some other fail-safe operation to place the system in a safe operating mode.

(2) When only the load driving transistor circuit 320 suffers an injury:

When, because of a failure in itself, the load driving transistor circuit 320 is stuck in the on or off state, the control circuit 310 can detect the abnormality by monitoring the output (Y1, Y0) of the monitor circuit 340 likewise, and take a fail-safe action.

(3) When the output monitor circuit 340 suffers an injury:

In this case, the output (Y1, Y0) of the monitor circuit 340 becomes the non-code state of (0, 0) or remains away from (1, 0) with a high probability without regard to the existence or nonexistence of a breakage or failure in the drive circuit 330 or the load driving transistor circuit 320. Therefore, the control circuit 310 can detect the abnormal condition and take the fail safe action.

The conventional system shown in FIG. 11 can also detect the abnormality by detecting a contradictory relationship between the load driving command signal of the control circuit and the output signal of the monitor circuit in any of these three cases (1)–(3). In the case of (3), however, the control system shown in FIG. 9 can detect the abnormality immediately regardless of whether the drive command signal of the control circuit is in the on state or the off state, because the output (Y1, Y0) of the monitor circuit 340 goes to the non-code state of (0, 0) with a high probability simultaneously with the occurrence of the abnormality.

(4) When the load driving transistor circuit 320 and the output monitor circuit 340 are broken simultaneously:

As in the case of (3), the output (Y1, Y0) of the monitor circuit 340 becomes (0, 0) with a high probability, and therefore, the system can detect the abnormality. Specifically, it is highly probable that the output (Y1, Y0) of the monitor circuit 340 is out of the state of (1, 0) indicating the off state of the load driving transistor circuit 320. Consequently, the control circuit 310 shuts off the fail-safe relay 30 reliably.

Even in the case in which the load driving transistor is accidentally fixed in a short circuit state, and the monitor circuit is fixed in the (logic one) state indicting the off state of the load driving transistor, so that the conventional system cannot detect the abnormality, the control system according to the fourth embodiment of the present invention can reliably detect the abnormality and take the fail-safe action.

As explained above, the fourth embodiment enables the reliable detection of simultaneous failures in circuits integrated in a single semiconductor chip without increasing the circuit size or scale.

Figure 10B:
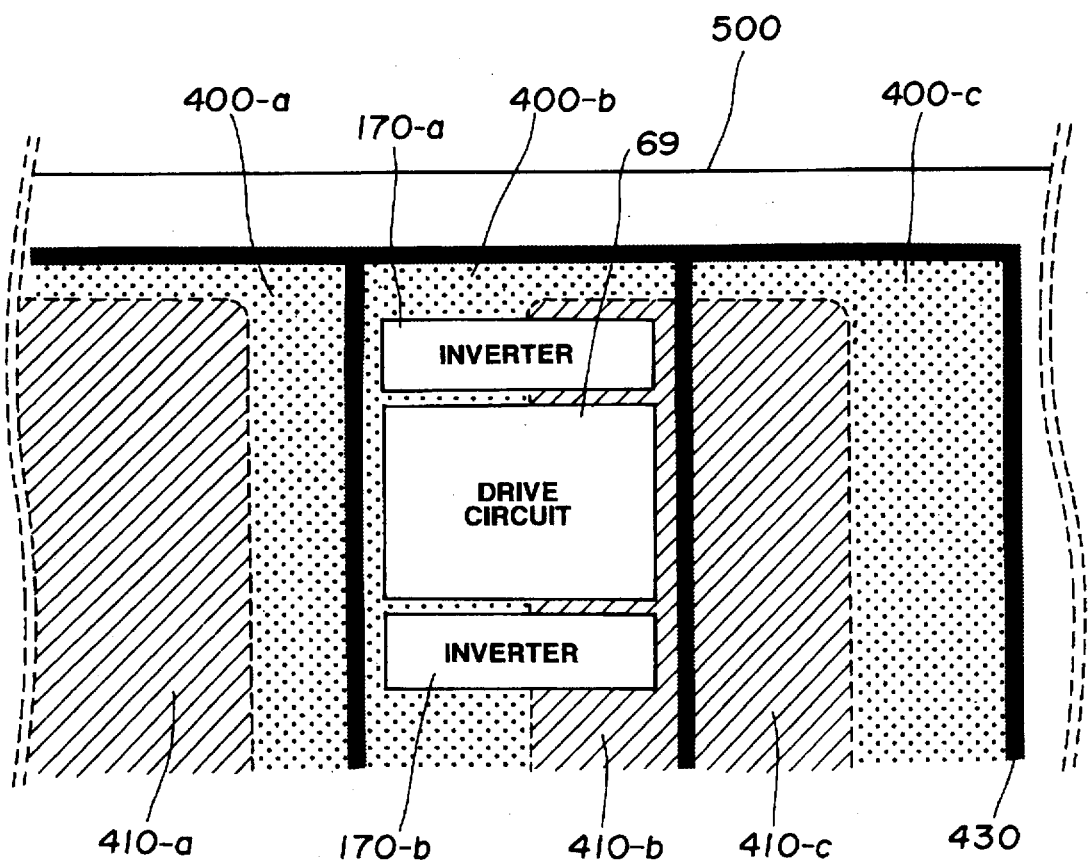
FIG. 10B is a top view of the semiconductor chip of FIG. 10A.

FIGS. 10A and 10B show a fifth embodiment of the present invention. FIG. 10A shows a semiconductor chip 500 according to the fifth embodiment in section, and FIG. 10B is a top view of the semiconductor chip 500. The semiconductor chip 500 of this example comprises a plurality of n type semiconductor islands 400-a, 400-b, 400-c and so on. These islands are isolated from one another by at least one insulating layer (or film) 430. This structure is called SOI structure. The insulating layer 430 is formed on an n-type substrate, and the n-type islands are formed on the insulating layer 430. Furthermore, the islands are separated by the insulating layer 430, as shown in FIG. 10A. Various devices are formed in these dielectrically isolated islands or pockets.

In each of the n-type islands 400-a, 400-b and 400-c, there are formed a P type MOS transistor 421-a, 421-b or 421-c having p type source and drain regions extending into the island and an insulated polysilicon gate, and an N type MOS transistor 420-a, 420-b or 420-c having an insulated polysilicon gate and n type source and drain regions formed in a p well 410-a, 410-b or 410-c which is formed in the n-type island. These N-type and P-type MOS transistors are interconnected by one or more of metallization layers of aluminum or polysilicon, for example, formed on an insulating film 440 to form a desired circuit.

In this example, the semiconductor structure shown in FIGS. 10A and 10B is applied to the system shown in FIG. 2A. The semiconductor chip 160 is replaced by the semiconductor chip 500. In this semiconductor chip 500, the circuits identical to the circuits in the semiconductor chip 160 shown in FIG. 2A are integrated. The semiconductor chip 500, therefore, has the load driving transistors 61–63, output monitor circuits 64–66 and drive circuits 67–69.

FIG. 10B shows inverters 170-a and 170-b which are components of the chip damage detecting circuit, and an adjacent circuit block of the drive circuit 69. These inverters and the drive circuit 69 are formed in the same island 400-b. Therefore, if the drive circuit 69 is injured, and becomes unable to perform its operation normally because of a potential change caused by an abnormality in the pn junction between the p well 410-b and the n-type island, then these inverters becomes abnormal so that the chip check signal can not be transmitted normally. The control circuit 50 detects this abnormality in the transmission of the chip check signal, and opens the fail-safe relay 30 to ensure the safety of the system.

Thus, the chip damage detecting circuit or line according to the present invention is formed proximately in the vicinity of, or immediately above or below, a function circuit so that the damage detecting circuit can be broken together with the function circuit. Therefore, without requiring an additional external detecting circuit and without increasing the size and scale of the circuit, the present invention enables the reliable detection of a combination of faults in the semiconductor chip which the conventional system cannot detect. The chip damage detecting technique according to the present invention can be combined with the conventional chip damage detecting technique to further improve the fail-safe performance of the system.

The control circuit 50 shown in FIG. 1 comprises a section or means for generating a chip check signal supplied to the chip check line 70, and a section or means for detecting an abnormal condition by monitoring the output signal sent from the chip check line 70. The control circuit 50 shown in FIG. 2A is constructed in the same manner. The control circuit 310 shown in FIG. 9 comprises a section or means for generating a chip check signal in the form of a two-wire logic command signal (Y1, Y0), and a section or means for detecting an abnormal condition by monitoring the output pair (Y1, Y0) of the output monitor circuit 340.

What is claimed is:

1. A fail-safe system comprising
   a semiconductor integrated circuit comprising at least two functional circuit sections;
   a chip check circuit for receiving a chip check signal for detecting a breakage in said semiconductor integrated circuit, said chip check circuit comprising a chip check line extending between at least the two functional circuit sections in a chip of said semiconductor integrated circuit;
   detecting means for detecting an abnormal condition by monitoring an output signal of said chip check circuit and producing an abnormality signal when said detecting means detects the abnormal condition; and
   fail-safe means for performing a fail-safe action in response to said abnormality signal.

2. A fail-safe system according to claim 1 wherein each of the at least two functional circuit sections is a function circuit, and said chip check line of said chip check circuit extends between the function circuits in a lateral geometry of said integrated circuit.

3. A fail-safe system according to claim 1 wherein the at least two functional circuit sections are portions of a function circuit, and said chip check line of said chip check circuit extends in said function circuit in a lateral geometry of said integrated circuit.

4. A fail-safe system according to claim 1 wherein said check circuit consists of said chip check line extending in the chip of said semiconductor integrated circuit.

5. A fail-safe system according to claim 1 wherein said check circuit comprises said chip check line extending in the chip of said semiconductor integrated circuit, and a plurality of chip check devices inserted in said check line.

6. A fail-safe system according to claim 1 wherein said system further comprises a chip check signal generating means for generating said chip check signal which is a periodic signal alternating between high and low levels.

7. A fail-safe system according to claim 1 wherein said system further comprises a chip check signal generating means for generating said chip check signal which is a non-sequential code signal.

8. A fail-safe system according to claim 1 wherein said check circuit is a series circuit extending all over a surface of the chip of said semiconductor integrated circuit.

9. A fail-safe system according to claim 5 wherein each of said check devices comprises an input end and an output end, and said check devices are connected in series by connecting the output end of a preceding component to the input end of a following component in any two consecutive devices.

10. A fail-safe system acceding to claim 5 wherein each of said check devices is formed adjacent to one of a plurality of circuit blocks constituting said integrated circuit.

11. A fail-safe system according to claim 5 wherein each of said check devices is an inverter gate circuit.

12. A fail-safe system according to claim 5 wherein each of said check devices is a circuit comprising a MOS transistor.

13. A fail-safe system according to claim 10 wherein each of said check devices shares a well region formed in the chip of said semiconductor integrated circuit, with an adjacent one of said circuit blocks.

14. A fail-safe system according to claim 10 wherein said integrated circuit comprises at least one dielectrically isolated semiconductor island in which at least one of said circuit blocks and at least one of said check devices are formed.

15. A semiconductor integrated circuit comprising:
   a circuit block which is formed in a predetermined area of a surface of a chip of said semiconductor integrated circuit and which comprises a function circuit, and an inverter circuit group adjacent to said function circuit, said inverter circuit group comprising first and second inverter circuits connected so that an output signal of said function circuit is outputted through said first and second inverter circuits;
   wherein said circuit block comprises first and second input points for receiving a block input signal which is a two-wire logic code signal, and said function circuit of said circuit block comprises an input logic converting circuit for converting the block input signal in the form of the two-wire logic code signal to an internal signal which is a one-wire logic signal;

wherein said circuit block comprises first and second output points for delivering a pair of output signals of said first and second inverter circuits as a block output signal which is a two-wire logic code signal;

wherein said circuit block further comprises a first signal line connecting said first and second inverter circuits and extending over said predetermined area of the surface of said chip, and a second signal line extending from an output point of said second inverter circuit over said predetermined area of said the surface of said chip;

wherein said integrated circuit further comprises power supply line and ground line which are connected with said circuit block, one of said supply line and said ground line covering said predetermined area of the surface of said chip; and wherein said semiconductor integrated circuit further comprises an output logic converting circuit for producing a chip output signal by converting a two-wire logic code signal to a one-wire logic code signal and delivering said chip output signal out of said integrated circuit.

16. A semiconductor integrated circuit according to claim 15:

wherein said first signal line extends from an output point of said first inverter circuit to an input point of said second inverter circuit, and said second signal line overlaps said first signal line over said predetermined area of the surface of said chip;

wherein each of said first and second signal lines overlaps the other and comprises a plurality of line segments which are connected end to end to form a single continuous line and which are distributed over said predetermined are of the surface of said chip;

wherein said function circuit comprises an output point connected to said input point of said first inverter circuit, the output point of said second inverter is connected to said first output point of said circuit block, and the output point of said first inverter circuit is connected to said second output point of said circuit block; and wherein said semiconductor integrated circuit comprises a plurality of said circuit blocks, which are connected together to form said integrated circuit.

17. A semiconductor integrated circuit according to claim 15 wherein one of said input logic converting circuit and said output logic converting circuit is a MOS transistor circuit for receiving first and second input signals forming a two-wire logic code signal, and delivering an output signal in response to said first and second input signals of said MOS circuit; said MOS transistor circuit comprises first and second MOS transistors of a type having a first conductivity type channel, and a first resistor; sources of said first and second MOS transistors are connected with one of said supply line and said ground line; said first MOS transistor comprises a gate for receiving said first input signal of said MOS transistor circuit, and a drain for receiving said second input signal of said MOS transistor circuit through said first resistor; and said second MOS transistor comprises a gate connected with the drain of said first MOS transistor, and a drain connected to an output point for delivering said output signal of said MOS transistor circuit.

18. A semiconductor integrated circuit according to claim 17 wherein said first and second MOS transistors are N channel MOS transistors, and the sources of said first and second MOS transistors are connected to said ground line.

19. A semiconductor integrated circuit according to claim 17 wherein said first and second MOS transistors are P channel MOS transistors, and the sources of said first and second MOS transistors are connected to said supply line.

20. A semiconductor integrated Circuit according to claim 17 wherein said MOS circuit further comprises third and fourth MOS transistors of a type having a second conductivity type channel, a second resistor, and first and second input points for receiving said first and second input signals of said MOS transistor circuit, respectively; the sources of said first and second MOS transistors are connected to one of said supply and ground lines, and the source of said third and fourth MOS transistors are connected to the other of said supply and ground lines; said first input point of said MOS circuit is connected to the gate of said first MOS transistor and a gate of said third MOS transistor; said second input point of said MOS circuit is connected to first ends of said first and second resistors, a second end of said first resistor is connected to the drain of said first MOS transistor and the gate of said second MOS transistor; a second end of said second resistor is connected to a drain of said third MOS transistor and a gate of said fourth MOS transistor; the drain of said second MOS transistor and a drain of said fourth MOS transistor are connected together to said output point of said MOS circuit.

21. A semiconductor integrated circuit according to claim 17 wherein a level fixing device is connected to an output of one of said input and output logic converting circuits, and said device is one of pull-up device and pull-down device.

22. A semiconductor integrated circuit according to claim 15 wherein one of said input logic converting circuit and said output logic converting circuit is a bipolar transistor circuit which comprises first and second bipolar transistors of a first type which is one of PNP type and NPN type, a first resistor, first and second input points for receiving first and second input signals forming a two-wire logic code signal, and an output point for delivering an output signal of said bipolar transistor circuit; emitters of said first and second bipolar transistors are connected with one of said supply line and said ground line; said first input point of said bipolar transistor circuit is connected with a base of said first bipolar transistor; said second input point of said bipolar circuit is connected through said first resistor to a collector of said first bipolar transistor and a base of said second bipolar transistor; and a collector of said second bipolar transistor is connected to said output point of said bipolar transistor circuit.

23. A semiconductor integrated circuit according to claim 22 wherein said first and second bipolar transistors are both NPN transistors and the emitters of said first and second bipolar transistors are connected to said ground line.

24. A semiconductor integrated circuit according to claim 22 wherein said first and second bipolar transistors are both PNP transistors and the emitters of said first and second bipolar transistors are connected to said supply line.

25. A semiconductor integrated circuit according to claim 22 wherein said bipolar transistor circuit further comprises third and fourth bipolar transistors of a type different from the type of said first and second bipolar transistors, and a second resistor; the emitters of said first and second bipolar transistors are connected to one of said supply and ground lines, and emitters of said third and fourth bipolar transistors are connected to the other of said supply and ground lines; said first input point of said bipolar transistor circuit is connected to the base of said first bipolar transistor and a base said third bipolar transistor, said second input point of said bipolar transistor circuit is connected to first ends of said first and second resistors; a second end of said first resistor is connected to the collector of said first bipolar transistor and the base of said second bipolar transistor; a second end of said second resistor is connected to a collector of said third bipolar transistor and a base of said fourth bipolar transistor; and the collector of said second bipolar transistor and a collector of said fourth bipolar transistor are connected together to said output point of said bipolar transistor circuit.

26. A semiconductor integrated circuit according to claim 22 wherein a level fixing device is connected to an output of one of said input and output logic converting circuits, and said device is one of pull-up device and pull-down device.

27. A semiconductor integrated circuit according to claim 15:

wherein said output logic converting circuit comprises first and second input points connected, respectively, with said first and second output points of said circuit block;

wherein said supply line is connected with said circuit block for supplying electric power to said circuit block, said ground line is connected with said circuit for providing a ground potential, one of said supply line and said ground line comprises a wide segment covering said predetermined area of the surface of said chip, and a width of said wide segment is greater than a width of each of said first and second signal lines;

wherein said first and second signal lines and said wide segment are formed, respectively, at three different levels if a multi-level interconnection structure, and separated from one another by intervening insulating layers;

wherein each of said first and second signal lines comprises a plurality of line segments connected end to end to form a single continuous line, and said line segments of said first and second signal lines are arranged in a systematic regular pattern over said wide segment, and each line segment of each of said first and second signal lines overlaps a unique one of said line segments of the other of said first and second signal lines; and wherein said circuit block further comprises a first output line for connecting the output point of said second inverter circuit to said first output point of said circuit block, and a second output line for connecting the output point of said first inverter circuit to said second output point of said circuit block.

28. A semiconductor integrated circuit according to claim 27:

wherein said circuit block comprises a level fixing resistor which is connected between the input of said second inverter circuit and one of said supply line and said ground line;

wherein each of said input logic converting circuit and said output logic converting circuits comprises a transistor circuit which comprises first and second input points for receiving, respectively, first and second input signals, a single output point for delivering a single output signal in response to said first and second input signals, first and second transistors of a predetermined type, and a resistor, said first transistor comprised a first electrode connected with one of said supply line and said ground line, a second electrode connected through said resistor with said second input point of said transistor circuit, and a control electrode connected with said first input point of said transistor circuit, and said second transistor comprises a first electrode connected with said first electrode of said first transistor, a second electrode connected with said output point of said transistor circuit, and a control electrode connected with said second electrode of said first transistor;

wherein said circuit block is a first circuit block; said semiconductor integrated circuit is constituted by a circuit block group which comprises said first circuit block and a second circuit block comprising a single input point for receiving a second block input signal, first and second output points, a function circuit comprising an input point connected with said single input point of said second circuit block and an output point, and an inverter circuit group comprising first and second inverter circuits adjacent to said function circuit of said second circuit block; said first inverter of said second block comprises an input point connected with the output point of said function circuit of said second block and an output point connected to said second output point of said second circuit block, said second inverter circuit comprises an input point and an output point which is connected to said first output point of said second block; second circuit block further comprises a first signal line connecting the output point of said first inverter circuit of said second circuit block with the input point of said second inverter circuit of said second inverter circuit, and a second signal line extending from the output point of said second inverter circuit of said second circuit block; one of said supply line and said ground line comprises a wide segment covering an area of said circuit block; said first and second signal lines overlaps each other and extend back and forth over said wide segment of said second block;

wherein the signal input point of said second circuit block is connected with the output point of said output logic converting circuit;

wherein said circuit block group comprises at least one preceding circuit block which is identical in construction to said first circuit block and which comprises first and second block input points connected, respectively, with first and second input points of said semiconductor integrated circuit, and first and second output points connected, respectively, with said first and second input points of said first circuit block, and at least one following circuit block which is identical in construction to said first circuit block and which comprises first and second input points connected, respectively, with said first and second output points of said second circuit block and first and second output points connected, respectively, with first and second chip output points of said semiconductor integrated circuit.

* * * * *